US010634633B2

(12) United States Patent
Mehregany

(10) Patent No.: US 10,634,633 B2
(45) Date of Patent: Apr. 28, 2020

(54) SMART PACKAGING FOR IMPROVED MEDICATION REGIMEN COMPLIANCE

(71) Applicant: QuantaEd, LLC, San Diego, CA (US)

(72) Inventor: Mehran Mehregany, San Diego, CA (US)

(73) Assignee: QuantaEd, LLC, San Diego, CA (US)

( * ) Notice: Subject to any disclaimer, the term of this patent is extended or adjusted under 35 U.S.C. 154(b) by 69 days.

(21) Appl. No.: 16/156,603

(22) Filed: Oct. 10, 2018

(65) Prior Publication Data

US 2019/0107501 A1 Apr. 11, 2019

Related U.S. Application Data

(60) Provisional application No. 62/570,328, filed on Oct. 10, 2017.

(51) Int. Cl.
*G01R 27/08* (2006.01)
*G01N 27/04* (2006.01)
(Continued)

(52) U.S. Cl.
CPC .......... *G01N 27/041* (2013.01); *A61J 1/035* (2013.01); *A61J 7/0076* (2013.01); *A61J 7/04* (2013.01);
(Continued)

(58) Field of Classification Search
CPC ...... G01N 27/041; G01N 27/06; G01N 27/20; G01N 27/02; H01L 2924/00014;
(Continued)

(56) References Cited

U.S. PATENT DOCUMENTS 8,733,432 B2 5/2014 LaBrecque et al.
2005/0252924 A1 11/2005 Pieper et al.
(Continued)

FOREIGN PATENT DOCUMENTS

WO 2009/116108 A1 9/2009

OTHER PUBLICATIONS

Ramani Duraiswami et al., "Efficient 2D and 3D electrical impedance tomography using dual reciprocity boundary element techniques", "Engineering Analysis with Boundary Elements", Abstract only, Sep. 21, 1998, Publisher: Elsevier B.V., 13-31, vol. 22, Iss 1, https://doi.org/10.1016/S0955-7997(98)00028-9.
(Continued)

*Primary Examiner* — Raul J Rios Russo
(74) *Attorney, Agent, or Firm* — Kaplan Breyer Schwarz, LLP

(57) ABSTRACT

The present disclosure enables apparatus and methods for tracking medications and/or product units via smart-packaging concepts. Embodiments include sensors that monitor the state of a blister-card package having an unpatterned lidding film by measuring the impedance of each dispensing region of the lidding film that defines a portion of a blister. In some embodiments, the impedance is measured via a plurality of contact points arranged on opposite sides of each dispensing region, where the contact points are resistively or capacitively coupled with the lidding film. In some embodiments, the impedance map of a measurement region on the blister card is derived via electrical impedance tomography or electrical resistance tomography, where the measurement region includes a plurality of dispensing regions.

36 Claims, 13 Drawing Sheets

(51) Int. Cl.
*A61J 1/03* (2006.01)
*A61J 7/00* (2006.01)
*G01N 29/06* (2006.01)
*A61J 7/04* (2006.01)
*G01N 27/06* (2006.01)
*G01N 27/02* (2006.01)
*G01N 27/20* (2006.01)
*H01L 21/66* (2006.01)

(52) U.S. Cl.
CPC ............ *G01N 27/02* (2013.01); *G01N 27/06* (2013.01); *G01N 29/0672* (2013.01); *A61J 2200/30* (2013.01); *A61J 2200/70* (2013.01); *G01N 27/20* (2013.01); *G01N 2291/0237* (2013.01); *G01N 2291/0258* (2013.01); *H01L 22/14* (2013.01); *H01L 2224/45015* (2013.01); *H01L 2224/45099* (2013.01); *H01L 2924/00014* (2013.01)

(58) Field of Classification Search
CPC . H01L 2224/45015; H01L 2224/45099; H01L 22/14

USPC .......... 324/76.11–76.83, 439, 459, 549, 600, 324/639, 649, 691, 693
See application file for complete search history.

(56) References Cited

U.S. PATENT DOCUMENTS

| | | |
|---|---|---|
| 2013/0285681 A1 | 10/2013 | Wilson et al. |
| 2013/0319902 A1 | 12/2013 | Tufi |
| 2016/0103085 A1 | 4/2016 | Mehregany |
| 2017/0294105 A1* | 10/2017 | Mehregany ............ G08B 21/24 |
| 2019/0201286 A1* | 7/2019 | Learmonth ............ A61J 7/0418 |
| 2019/0244510 A1* | 8/2019 | Mehregany ............ A61J 7/0436 |

OTHER PUBLICATIONS

International Search Report and Written Opinion issued in International Patent Application No. PCT/US18/55267 dated Dec. 11, 2018.

* cited by examiner

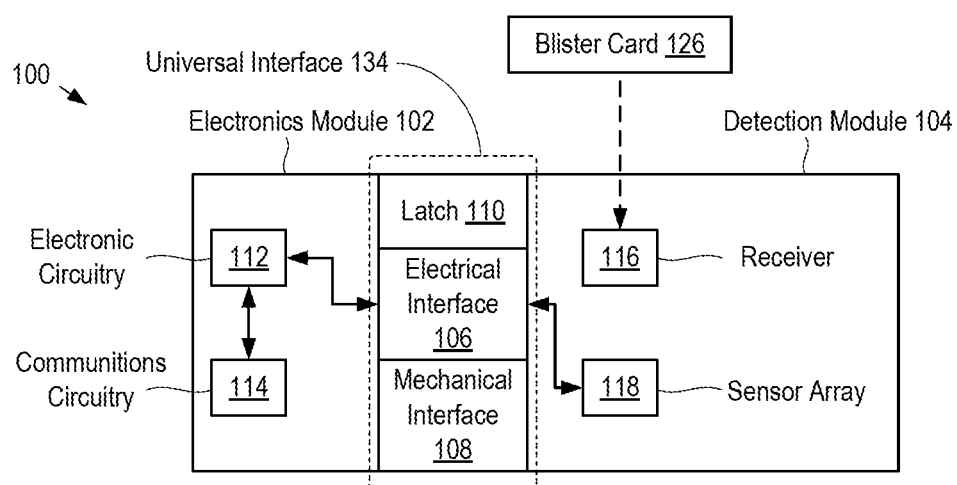
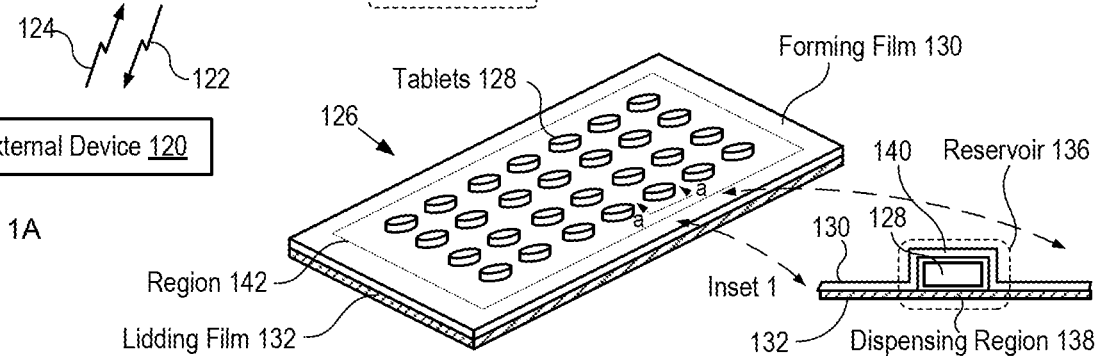
FIG. 1A
FIG. 1B
view through line a-a view along the x-direction

# SMART PACKAGING FOR IMPROVED MEDICATION REGIMEN COMPLIANCE

CROSS REFERENCE TO RELATED APPLICATIONS

This application claims the benefit of U.S. Provisional Patent Application Ser. No. 62/570,328, filed Oct. 10, 2017, entitled "Smart Packaging for Improved Medication Regimen Compliance," which is incorporated herein by reference.

If there are any contradictions or inconsistencies in language between this application and the case that has been incorporated by reference that might affect the interpretation of the claims in this case, the claims in this case should be interpreted to be consistent with the language in this case.

TECHNICAL FIELD

The present disclosure relates to packaging in general, and, more particularly, to smart packaging.

BACKGROUND

Adherence to prescribed medication regimen is central to achieving intended health outcome. However, it is well known in the industry that adherence is generally poor across various medications. As a result, intended health outcomes are compromised, placing cost on the healthcare system for remedial care. By way of example:

The total direct cost of unintended pregnancy in 2010 is $11B. A publicly funded birth in 2010 cost ~$12,770. 51% of all U.S. births in 2010 were paid for by public insurance. Public insurance paid for 68% of the 1.5 million unplanned births in 2010, compared with 38% of planned birth.

These numbers would be as if the U.S. federal and state governments spent ~$336 on unintended pregnancies for every woman aged 15-44.

Women of childbearing age use various forms of birth control, of which the oral contraceptive pill (OCP) is a common choice. Poor adherence to OCP regimens is the main cause of unintended pregnancy for women using OCP.

A common approach to improving medication adherence has been "reminders". Reminder notifications are typically automated and delivered in the form of alarms, text message, calls and/or e-mails. A mobile device—usually a smart phone or tablet—running mobile application software is often the user interface for receiving such notifications. Alternatively, medication may be placed in a case/vessel/package that incorporates electronic provisions for tracking adherence and issuing audio/visual notifications. In some cases, the case/vessel/package may be wirelessly linked to a mobile device to notify the user on the mobile device and on the vessel/package both. Approaches such as the above are commonly referred to as "smart packaging".

SUMMARY

The present disclosure teaches systems and methods that facilitate tracking of adherence to medicine regimens, such as medicine prescription regimens, through connected, smart packaging. Embodiments in accordance with the present disclosure are particularly well suited for use with blister cards having a forming film in which a plurality of blisters is formed and an electrically conductive lidding film, where the blisters and lidding film collectively define a plurality of reservoirs for holding one or more tablets. Each reservoir is defined by a blister formed in the forming film and a dispensing region that includes a portion of the lidding film.

An illustrative embodiment is a modular smart case that includes an electronics module and a detection module. The detection module comprises a housing having a receiver for removably locating a blister card in a first position in which its lidding film is held against (i) a sensor array that includes a substrate having a platen and an array of through-holes and (ii) a seat that includes a plurality of dispense holes. The tablets of the blister card, the sensors and through-holes of the sensor array, and the dispense holes are all arranged in the same arrangement. The receiver locates the blister card such that each reservoir of the blister card is aligned with a different sensor and dispense hole. The receiver includes a plurality of electrical connectors that electrically couple, resistively or capacitively, with the lidding film of the blister card to electrically ground the lidding film and confirm that it is located in the receiver.

Each sensor of the sensor array includes a pair of electrical contacts that are located on either side of its respective through-hole and configured to electrically couple with the lidding film. The electrical contact are configured to measure the impedance across the dispensing region of its respective reservoir. When the tablet is dispensed from the reservoir, the dispensing region is ruptured, thereby changing the impedance measured by the contacts of the sensor with which it is operatively coupled.

The through-hole of each sensor includes a serration that is configured to facilitate the breakage of the lidding film near it when force is applied to its respective tablet from the blister side. In some embodiments, the serration is a continuous "blade" that surrounds the periphery of the dispense hole. In some embodiments, the serration includes one or more substantially discrete tips that are dimensioned and arranged to concentrate the applied force within a smaller area of the lidding film to initiate its puncture. Preferably, a serration in accordance with the present disclosure has a low profile to mitigate the risk of injury to a user during a dispensing operation.

In some embodiments, a plurality of connectors is distributed around the perimeter of a region of the blister card such that, when the blister card is in the first position, the state of the region is determined using electrical impedance tomography.

In some embodiments, the plurality of electrodes used to electrically couple with the lidding film is located on the platen. In some embodiments, the plurality of electrodes is distributed between the receiver and the seat.

An embodiment of the present invention is a smart case (100) for monitoring the state of a blister card (126) that includes a forming film (130), a lidding film (132) that includes a first region (142) that is electrically conductive and unpatterned and includes a plurality of dispensing regions (138) within the first region, and a plurality of tablets (128) contained in a plurality of reservoirs (136) that is arranged in a first arrangement, each reservoir being defined by the forming film and a different dispensing region of the plurality thereof, wherein the case comprises: (1) an electronics module (102); and (2) a detection module (104) that includes: (i) a housing (302) having a lid (318) and a body (316), wherein the lid is movable relative to the body; and (ii) a receiver (116) that includes a frame (304), a seat (306), and a plurality of connectors (336) that are electrically connected with the electronics module when the electronics module and detection module are operatively coupled, the receiver being configured to removably locate the blister card such that the lidding film and connectors are electrically coupled; wherein the electronics module includes electronic circuitry (112) that is configured to measure a first impedance across at least a portion of the first region when the blister card is located in the receiver.

Another embodiment of the present invention is a method for monitoring the state of a blister card (126) that includes a forming film (130), a lidding film (132) that includes a first region (142) that is electrically conductive and unpatterned and includes a plurality of dispensing regions (138) within the first region, and a plurality of tablets (128) contained in a plurality of reservoirs (136) that is arranged in a first arrangement, each reservoir being defined by the forming film and a different dispensing region of the plurality thereof, wherein the method comprises: (1) locating a blister card in a receiver (116) that includes a frame (304), a body (316), and a plurality of connectors (336), wherein the blister card is located in the receiver such that each connector of the plurality thereof is electrically coupled with the lidding film; (2) measuring a first impedance across at least a portion of the first region; and (3) transmitting a status signal (122) that is based on the measured first impedance.

BRIEF DESCRIPTION OF THE DRAWINGS

FIG. 1A depicts a functional block diagram of a modular medicine case in accordance with an illustrative embodiment in accordance with the present disclosure.

FIG. 1B depicts a schematic drawing of a perspective view of a blister card in accordance with the illustrative embodiment.

DETAILED DESCRIPTION

Figure 2:
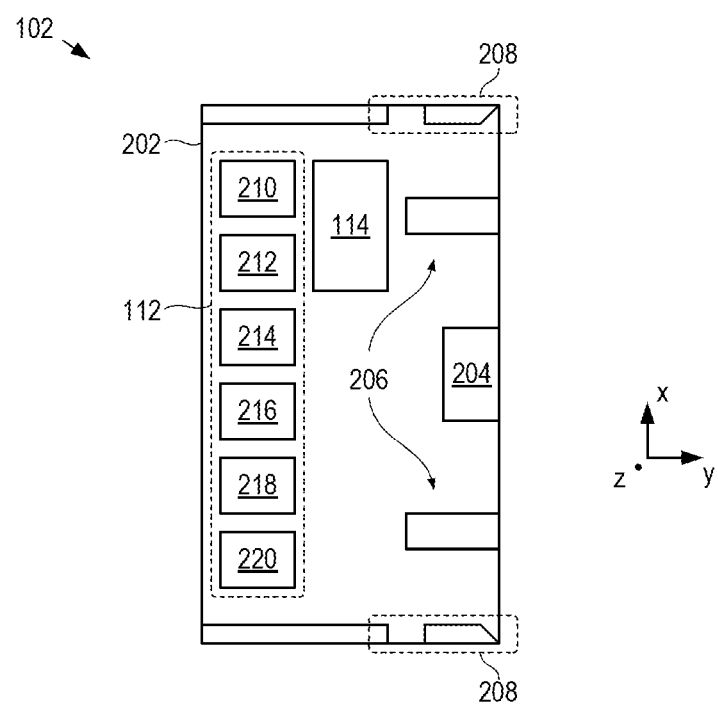
FIG. 2 depicts a schematic drawing of an electronics module in accordance with the illustrative embodiment.

It should be noted that, although embodiments in accordance with the present disclosure are described herein with respect to OCP as an exemplary application, concepts of the present disclosure are applicable to a wide range of other applications; therefore, the use of OCP should not be viewed as limiting the scope of the utility of the concepts described herein. Other examples of applications in which the smart packaging concepts of the present disclosure can be used include, without limitation, other forms of medication, non-medication products (e.g., vitamins, supplements, etc.), foodstuff, gum, beverages, toiletry and beauty care products, razor blades, consumer electronics, toner cartridges, toys, tools, etc. In other words, the teachings of the present disclosure are applicable to myriad product-tracking applications. In this Specification, "tablet" and "pill" are used interchangeably and are intended to include various form factors, sizes and compositions.

FIG. 1A depicts a functional block diagram of a modular medicine case in accordance with an illustrative embodiment in accordance with the present disclosure. Case 100 includes electronics module 102, detection module 104, and universal interface 134. for joining the electronics and detection modules. Universal interface 132 includes electrical interface 106, mechanical interface 108, and latch 110. Case 100 is a modular smart case for tracking the state of blister card 126, which in the depicted example, is a 4×7 format OCP blister card. Although case 100 is a modular case that includes separable electronics and detection modules, the teachings of the present disclosure are applicable to smart cases having electronics and detection modules that are not separable and the description of a modular case should not be considered limiting to the scope of the appended claims.

FIG. 1B depicts a schematic drawing of a perspective view of a blister card in accordance with the illustrative embodiment. A cross-section of one tablet region of the blister card is shown in Inset 1, where the cross-section is through line a-a of FIG. 1B.

Blister card 126 includes a plurality of tablets 128, each of which is contained within reservoir 136. Reservoir 136 is formed by blister 140 of forming film 130 and dispensing region 138. Dispensing region 138 is the region of lidding film 132 that forms the bottom of reservoir 136 and is the lidding-film portion through which tablet 128 is pushed when it is dispensed. In some embodiments, case 100 is configured to operate with a blister card in which at least one reservoir 136 includes a plurality of tablets 128.

Forming film 130 is a layer of thermoformed plastic in which cavities for holding tablets 128 are formed.

Lidding film 132 is a thin sheet of aluminum foil. In some embodiments, lidding film 132 is a sheet of another electrically conductive material. In some embodiments, lidding film 132 includes a sheet of conductive material and a sheet of electrically insulating material, such as a paper sheet (with a printed calendar or instructions), polymer, etc. on the bottom side of the lidding film and/or sandwiched between the lidding and forming films. After tablets 128 are dispensed into the cavities of forming film 130, lidding film 132 is joined with the forming film 130 to seal the cavities, thereby forming reservoirs 136, which enclose tablets 128.

Typically, a calendar that describes the drug regimen is printed on the card and/or otherwise provided as part of the blister card.

It is an aspect of the present disclosure that the teachings herein are suitable for use with any blister card whose lidding film 132 is unpatterned (i.e., has not been patterned to define electrically conductive traces). In other words, before any of tablets 128 have been dispensed, the electrically conductive material of lidding film 132 of blister card 126 exists everywhere within two-dimensional region 142.

The portion of lidding film 132 that seals each cavity to form a reservoir defines dispensing region 138, through which its respective tablet 128 is dispensed by pushing the tablet through the lidding foil.

One skilled in the art will recognize that many types of medication and non-medication (e.g., vitamins, supplements, etc.) are offered in a form suitable for packaging in a blister card, such as tablets, capsules, lozenges, etc. For the purposes of this Specification, including the appended claims, the term "tablet" is used as a general term that encompasses all such medicinal and non-medicinal forms.

FIG. 2 depicts a schematic drawing of an electronics module in accordance with the illustrative embodiment. Electronics module 102 includes housing 202, electronic circuitry 112, communications circuitry 114, socket 204, ports 206, and catches 208.

Housing 202 is a conventional molded plastic housing configured to enclose electronics circuitry 112 and communications circuitry 114 in a substantially environmentally sealed environment.

Electronic circuitry 112 includes controller 210, memory 212, sensor circuit 214, power circuit 216, display circuit 218, and sleep-mode circuitry 220. The circuitry included in electronics circuitry 112 enable it to interface with the sensor array included in detection module 104, as well as receive and condition the output signals of each sensor (e.g., provide pre-amplification, digitization, etc.), provide power conditioning and management, display information to the user, etc.

Controller 210 is a conventional processor having signal processing and computation capabilities.

Memory 212 is a conventional memory module for storing information and data.

Sensor circuit 214 is configured to receive sensor signals from the sensor array of detection module 104 via electrical interface 106, measure the sensor signals to detect changes in the state of a blister card held in the detection module, and the like.

Power circuit 216 includes an energy-storage unit and power management circuitry. In the depicted example, the energy-storage unit is a rechargeable battery; however, a different energy-storage unit can be used in power circuit 216 without departing from the scope of the present disclosure. Energy-storage units suitable for use in embodiments in accordance with the present disclosure include, without limitation, non-rechargeable batteries, super capacitors, and the like. In some embodiments, power circuit 216 includes one or more energy-scavenging devices (e.g., solar cells, vibration harvesters, etc.) for passively recharging the energy-storage unit.

Display circuit 218 includes a status indicator and drive circuitry for the status indicator. In the depicted example, the status indicators are light-emitting diodes (LED); however, other status indicators, such as liquid-crystal displays, LED-based displays, speakers, buzzers, and the like, can be used in display circuit 218 without departing from the scope of the present disclosure.

Display circuit 218 includes an LED for each row and column of pills to signal their respective row and column, where the LEDs illuminate (or blink) to indicate the respective row and column from which the pill should be dispensed. In some embodiments, each row and column have a pair of LEDs of different colors that guide the user to the correct tablet by turning on (or blinking) the respective LED of a first color, while cautioning the user against the other tablets by turning on (or blinking) the LEDs of the other color. In some embodiments, row/column addressing LEDs are located at the periphery of the blister card within detection module 104. In some embodiments, each tablet site is provided its own dedicated LED or LED pair.

In some embodiments, display circuit 218 includes provisions for user feedback to, for example, correlate a patient's health status and the need for the medication in the content compartment of smart case 100. In some embodiments, a status indicator is binary (e.g., good or bad). In some embodiments, a status indicator is more nuanced (e.g., good, fair, poor or bad). Typically, status feedback is generated via user-actuated buttons located on the case. In some embodiments, a touch screen display is incorporated in smart case 100 to enable communication of information to the user.

Sleep-mode circuitry 220 includes low-power dissipation circuitry, a wake-up circuit, and a low-power-dissipation accelerometer. Sleep-mode circuitry 220 facilitates long battery life between charges by enabling an extremely low-power dissipation mode during periods of case inactivity. Other types of sensors (e.g., touch, plunger switch under the lid of the case, finger print, radio frequency, etc.) can also be used in realizing a wake-up circuit. In some cases, a combination of sensors are used for implementing a wake-up circuit. In response to an environmental stimulus, such as detection of activity in the case of the accelerometer (e.g., shock and/or vibration associated with shaking the case, etc.), a wake-up signal received from external device 120, and the like, the wake-up circuit activates electronics circuitry 112 such that it operates in a conventional power-dissipation mode in which it can determine the state of the blister card located in detection module 104 and output its status to the user.

Communications circuitry 114 includes a wireless Bluetooth Low-Energy (BLE) transceiver for sending status signal 122 to external device 120 and receiving operational communications 124 from external device 120. In some embodiments, communications circuitry includes a different wired and/or wireless communications electronics, such as FireWire, USB, lightning connector, a dock connector, cellular, WiFi, near-field-communications (NFC) radio, optical links, etc.

In the depicted example, external device 120 is a smart phone that runs a software application (i.e., a mobile app) that provides assistance to the patient and/or caregiver to achieve and maintain good adherence to the prescribed drug regimen. In some embodiments, external device 120 is a different device, such as a different mobile device (e.g., smart watch, computer tablet, etc.), a computer, a gateway and/or a base station.

The smart case and smartphone app determine the state of the blister card and provide a visual and/or audible indication of adherence. If failure to follow the regimen is detected, the smartphone contacts one or more people in the user's defined support group (e.g., a caregiver, spouse, child, doctor, etc.) to alert them that the user might require assistance.

Socket 204 is a conventional electrical socket that is a first portion of electrical interface 106. Socket 204 is configured to receive a plug disposed on detection module 104. Once the socket and plug are engaged, electrical communication between electronics circuitry 112 and sensor array 118 on the detection module is enabled.

Ports 206 are a pair of conventional female mechanical connectors that collectively define a first portion of mechanical interface 108. Ports 206 are configured to engage a pair of conventional male mechanical connectors included in detection module 104. In the depicted example, the ports and male mechanical connectors are configured to enable only one orientation between the electronics and detection modules (i.e., they are "keyed") to ensure that the modules engage properly.

Catches 208 are mechanical structures that define a first portion of latch 110. Each of catches 208 is configured to engage a mating spring bolt that extend from the mating surface of detection module 104. Catches 208 reversibly lock the two modules together to form a fully assembled smart medicine case.

It should be noted that the configuration and capabilities of electronics module 102 described above is merely exemplary and that myriad alternative configurations having more or less electronics functionality can be used for the electronics module without departing from the scope of the present disclosure. For example, in some embodiments, electronics module 102 includes, without limitation:

i. additional processing capability; or
 ii. onboard clock circuitry; or
 iii. energy scavenging systems, or
 iv. alternative or additional sensor interface circuitry; or
 v. alternative or additional on-case alerts (e.g., LCD displays, speakers, buzzers, etc.); or
 vi. environmental (e.g., touch, temperature, acceleration, humidity, shock, geolocation, etc.) sensors; or
 vii. any combination of i, ii, iii, iv, v, and vi.

In some embodiments, smart case 100 includes a microphone and/or speakers, as well as artificial intelligence and machine learning software, such that the smart case is substantially functional as a virtual assistant. In some embodiments, smart case 100 is provisioned to connect and work with smart speakers to provide virtual assistant functionality.

One skilled in the art will recognize, after reading this Specification, that the design features of smart case 100 are based on the particular arrangement of blister card 126, as well as the sensing technology used to monitor its state and, as provided herein, are merely exemplary. Myriad alternative design features are possible without departing from the scope of the present disclosure.

Figure 3A:
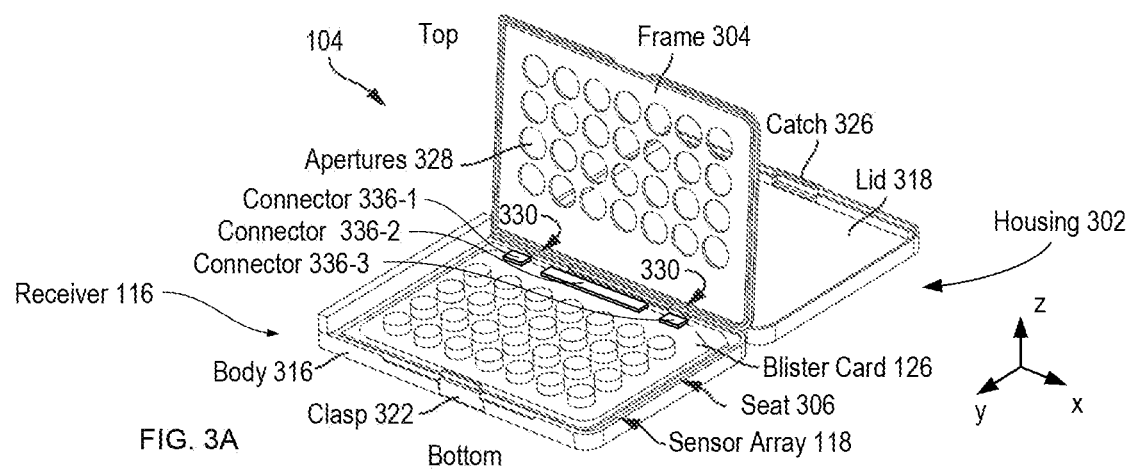
FIGS. 3A-B depict schematic drawings of perspective views from the top and bottom sides of a detection module in accordance with the illustrative embodiment.
Figure 3B:
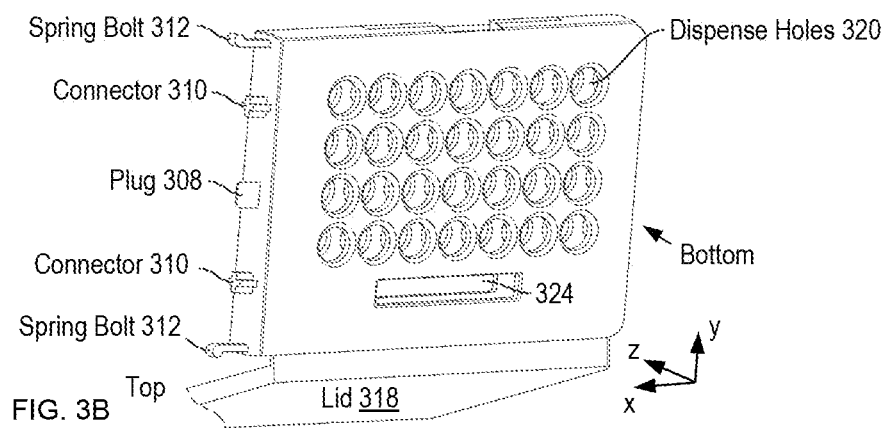

FIGS. 3A-B depict schematic drawings of perspective views from the top and bottom sides of a detection module in accordance with the illustrative embodiment. Detection module 104 includes housing 302, receiver 116, sensor array 118, plug 308, connectors 310, and spring bolts 312.

Housing 302 is a conventional molded plastic housing comprising body 316 and lid 318, which is typically connected to body 316 via a flexible hinge portion.

Body 316 comprises seat 306, dispense holes 320, clasp 322, and optional view port 324.

Figure 3C:
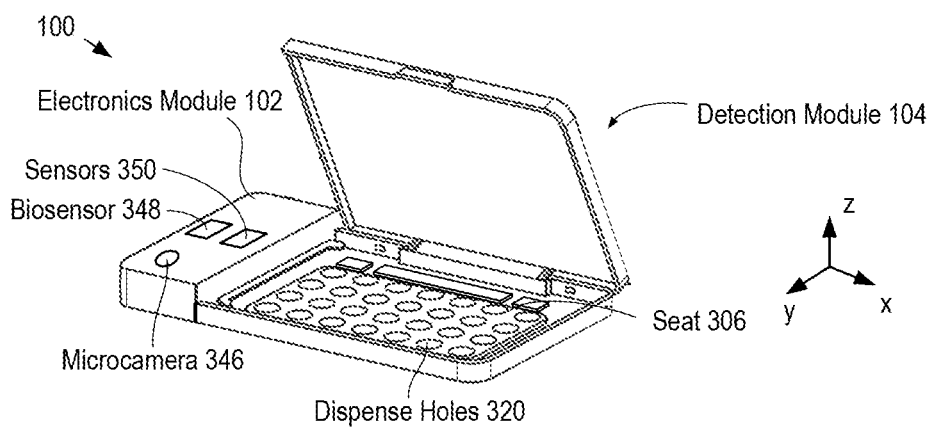
FIG. 3C depicts a schematic drawing of a perspective view of smart case 100.

FIG. 3C depicts a schematic drawing of a perspective view of smart case 100. Each dispense hole 320 is aligned with a different sensor of sensor array 118. FIG. 3C depicts smart case 100 in its assembled state (i.e., wherein electronics module 102 and detection module 104 are mechanically and electrically engaged). It should be noted that, for clarity, neither sensor array 118 nor frame 304 is shown in FIG. 3C.

The arrangement of dispense holes 320 matches that of the arrangement of tablets in blister card 126, thereby enabling each dispense hole to pass a different tablet 128 through body 316 when that tablet is dispensed.

View port 324 is an opening formed in body 316 to expose a portion of blister card 126 for viewing. View port 324 is optionally included to enable information printed on a blister card (such as a bar code, etc.) to be read through housing 302.

Lid 318 is a substantially rigid "clam shell" structure that includes catch 326, which engages clasp 322 when lid 318 is closed to hold the body and lid together.

Figure 3D:
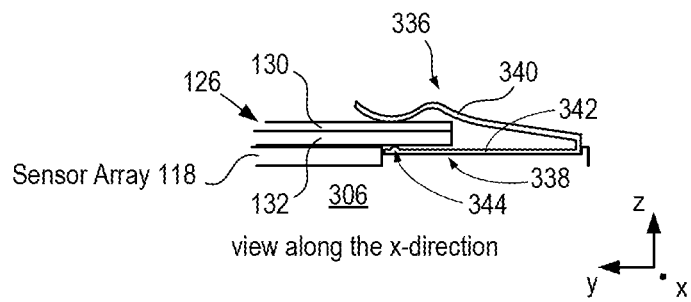
FIG. 3D depicts a side view of a representative connector 336 engaged with blister card 126.
Figure 4:
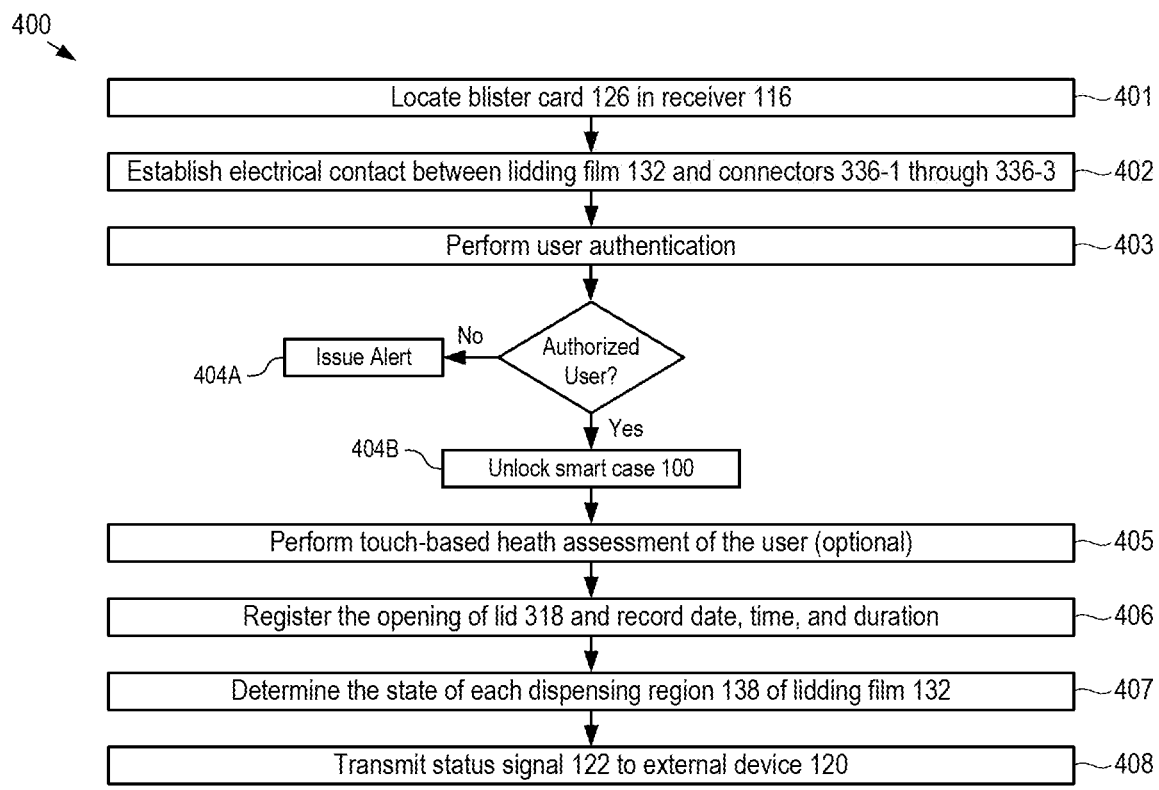
FIG. 4 depicts operations of a method suitable for monitoring the state of a blister card in accordance with the illustrative embodiment.

FIG. 4 depicts operations of a method suitable for monitoring the state of a blister card in accordance with the illustrative embodiment. Method 400 is described herein with continuing reference to FIGS. 3A-C, as well as reference to FIGS. 3D, 4, 5, and 6A-B. Method 400 begins with operation 401, wherein blister card 126 is loaded into receiver 116.

Receiver 116 includes frame 304, seat 306, sensor array 118, and connectors 336-1 through 336-3.

Frame 304 and seat 306 are collectively configured to locate sensor array 118 and hold blister card 126 such that each tablet location of the blister card is operatively coupled with a different sensor of the sensor array and a different hole of dispense holes 320.

Frame 304 is a substantially rigid plate comprising apertures 328, each of which exposes a different tablet of the blister card when the frame is locked in place. Frame 304 is connected to body 316 via conventional hinges 330, which allow the frame to rotate out of the way to enable installation of a blister card in the detection module and rotate back over the blister card to engage with a catch (not shown) that secures the frame and blister card to body 316. In some embodiments, frame 304 includes ribs between the rows and or columns of apertures to enhance the rigidity of the frame. In some of these embodiments, the ribs project downward toward sensor array 118, which resides on seat 306 such that they help force blister card 126 against the sensor array when the frame is engaged with its corresponding catch. It should be noted that lid 318 and hinges 330 are configured to avoid mechanical interference between them.

Seat 306 is a recessed region of body 316 that is configured to accept sensor array 118 and blister card 126 and laterally position the blister card to align its tablets with the sensors and through-holes of sensor array 118, as well as dispense holes 320. In some embodiments, seat 306 is not included. In some embodiments, seat 306 is formed as part of frame 304. In some embodiments, the alignment functionality of seat 306 is realized via raised features placed at the perimeter of the blister card, rather than a full perimeter frame. In some embodiments, sensor array 118 includes raised features for laterally positioning a blister card.

In order to ensure good electrical coupling/contact between lidding film 132 and sensor array 118, a good mechanical contact between the blister card and the surface on which it rests is needed. In some embodiments, the inside surface of the lid of the case incorporates a compressible liner that exerts downward pressure on the blister card when the case is closed to accomplish a good mechanical contact. An added benefit of such a liner is that the card is immobilized in place when the lid is closed. Such a compressible liner can comprise any of a variety of materials, such as foam, sponge, bubble wrap, spring-load plates, and the like.

Preferably, the liner is attached to the inside surface of the lid, but can also be used without such attachment—like a cushion or a packing.

At operation 402, electrical contact is established between lidding film 132 and each of connectors 336-1 through 336-3.

FIG. 3D depicts a side view of a representative connector 336 engaged with blister card 126. Each of connectors 336-1 through 336-3 (referred to, collectively, as connectors 336) is a conventional "leaf-spring" wiper contact that includes spring portion 340, base portion 342, and optional projection 344.

Connectors 336 are configured to enable insertion of an edge of blister card 126 between spring portion 340 and base portion 342. Each of the connectors 336-1 through 336-3 is configured such that spring portion 340 exerts a downward force on the blister card that helps keep the blister card in place and also facilitates good electrical contact between the connector and lidding film 132. In the depicted example, connectors 336 include optional projection 344, which concentrates the force applied by spring portion 340 between projection 344 and the lidding film.

In the depicted example, seat 306 includes optional recess 338, which is configured to mount connectors 336-1 through 336-3 such that the top of the base portion of each connector—housed in recess 338—is substantially flush with the top surface of seat 306.

Although in the illustrative embodiment connectors 336 are leaf-spring connectors, it should be noted that myriad alternative connectors can be used to provide good mechanical and electrical coupling/contact with lidding film 132 without departing from the scope of the present disclosure. For example, in some embodiments, at least one of connectors 336 is a clamp-like connector. Furthermore, in some embodiments, at least some of the functionality of connectors 336-1 through 336-3 is realized via contacts disposed on the surface on which the lidding film rests.

In the depicted example, connectors 336 are electrically connected to electronic circuitry 112 such that connector 336-2 is electrically connected to ground. As a result, when blister card 126 is inserted into detection module 104, lidding film 132 is electrically grounded. In addition, electronic circuitry 112 measures the resistance between connectors 336-1 and 336-3. Detection of a non-infinite resistance between connectors 336-1 and 336-3 confirms that blister card 126 is inserted into the detection module.

As discussed below, in some embodiments, connectors 336 are not in direct physical contact with lidding film 132 due to an intervening insulating layer. In such cases, connectors 336 are capacitively coupled with the lidding film and the electrical impedance is measured between connectors 336-1 and 336-3 to establish whether blister card 126 is inserted into the detection module. For the purposes of this Specification, including the appended claims, the terms "impedance" and "resistance" are used interchangeably.

In some embodiments, connectors 336-1 and 336-3 are locally connected to electronic circuitry located within detector module 104 itself.

In addition, in some embodiments, connectors 336 also guide the placement of blister card 126 in case 100, where the blister card is inserted into the clips by sliding it under the clips.

Exemplary smart case 100 also includes optional microcamera 346 and biosensor 348.

At operation 403, user authentication is performed by taking an image of the user via microcamera 346 and comparing the acquired image with one or more authorized-user images stored in memory 212. In some embodiments, user authentication is performed via a finger-print sensor instead of, or in addition to, microcamera 346.

If user authentication fails, method 400 proceeds with operation 404A, wherein an alert is generated. In the depicted example, the alert is generated as an audible alarm emitted by a speaker located on the case (not shown). In some embodiments, the alert includes a message sent to a corresponding app on the user's phone, and/or through an e-mail to the user, or someone designated by the user, and the like. Typically, such a message includes the time and/or case location when the lid was opened, what tablet was dispensed, etc., which is also stored in memory 212 for future synching with the phone/network if (wireless) connection is not available at the time.

If user authentication succeeds, at least one of catch 326 and clasp 322 is electrically actuated to release lid 318 from body 316 thereby enabling smart case 100 to be opened. It should be noted that the use of electrically actuated catches and/or clasps are optional; however, preventing smart case 100 from being opened without proper authentication provides real-time safeguards against unauthorized access to the content compartment.

At optional operation 405, a health assessment of the user is performed. Such an assessment is performed via biosensor 348 and/or sensors 350.

Biosensors 348 are conventional multi-electrode touch sensors suitable for measuring a user parameter, such as bio-impedance and/or bio-potential measurements. For example, the user may touch (e.g., with his/her index fingers) two electrodes for a one-lead electrocardiogram (ECG) measurement. In some embodiments, three or more electrodes are disposed on electronics module 102 to enable a more comprehensive ECG measurement, for example: monitor outcome along with adherence for heart disease patients using a smart pill case for heart disease medication; monitor side effects and/or interactions of OCP or other medications the user is taking in addition to the prescribed medication, and the like.

Sensors 350 include environmental sensors, such as gas sensors, which enable, among other things: to monitor environmental constituents and correlate them to the health and wellness conditions of the user; breath analysis (alone or in combination with humidity and temperature sensors) to monitor bad, cigarette and alcohol constituents, disease states, etc. Sensor data can be used to, for example: to alert the user to dispense a breath mint or piece of gum from the content compartment if halitosis is detected; warn the user to delay taking medication when an improper alcohol content of the breath is detected; warn the user that environmental factors (e.g., temperature, humidity, air quality, etc.) are potentially dangerous for patients with respiratory sensitivities and diseases and alert the user to take his/her corresponding medication in the content compartment and correlate the corresponding environmental factors that trigger the need for a dose, and the like.

It should be noted that touch- and gas-sensor data can be used in association with medicinal or non-medicinal use of smart case 100. For example, a smart case used to hold blister-packaged gum can be configured to alert the user when sensor data indicates a condition, such as bad breath (e.g., due to food consumption, cigarette use, alcohol consumption, etc.), that can be mitigated by taking a piece of gum from the smart case. Furthermore, tracking the sensor data and actions can help a user better address related concerns.

In some embodiments, one or more gas sensors are incorporated within one or both of electronics module 102 and detection module 104 such that the user uses the sensors by blowing onto a port that is fluidically coupled with the sensors. An ultraviolet radiation sensor on a case placed next to a user can for example be used to alert the user to apply sunblock from the content compartment of the case. It should be noted that health assessment of a user, as described above, is applicable for use with other containers, such as pill bottles, multi-tablet blister cards, and the like. Examples of containers for which user health assessment is particularly well suited are described in such as those described in U.S patent application Ser. No. 14/879,874, filed Oct. 9, 2015, Ser. No. 15/170,121, filed Jun. 1, 2016, Ser. No. 15/223,779, filed Jul. 29, 2016, and U.S. Provisional Patent Applications Ser. No. 62/062,291 filed on Oct. 10, 2014, 62/320,234 filed on Mar. 25, 2016, and 62/320,234 filed on Apr. 8, 2016, each of which is incorporated herein by reference.

At operation 406, the opening of lid 318 is registered and stored in memory 212. The opening of lid 318 is sensed by an electrical plunger switch (not shown), which is mechanically coupled with the lid. Triggering of the switch typically initiates several actions, such as recording date, time and duration. In some embodiments, the opening of lid 318 initiates a wakeup circuit is included to reduce power consumption when the case is not in use. Wakeup circuits in accordance with the present disclosure can include, without limitation, accelerometers, touch circuits, etc.

At operation 407, sensor array 118 determines the state of each dispensing region 138 of lidding film 132.

Figure 5:
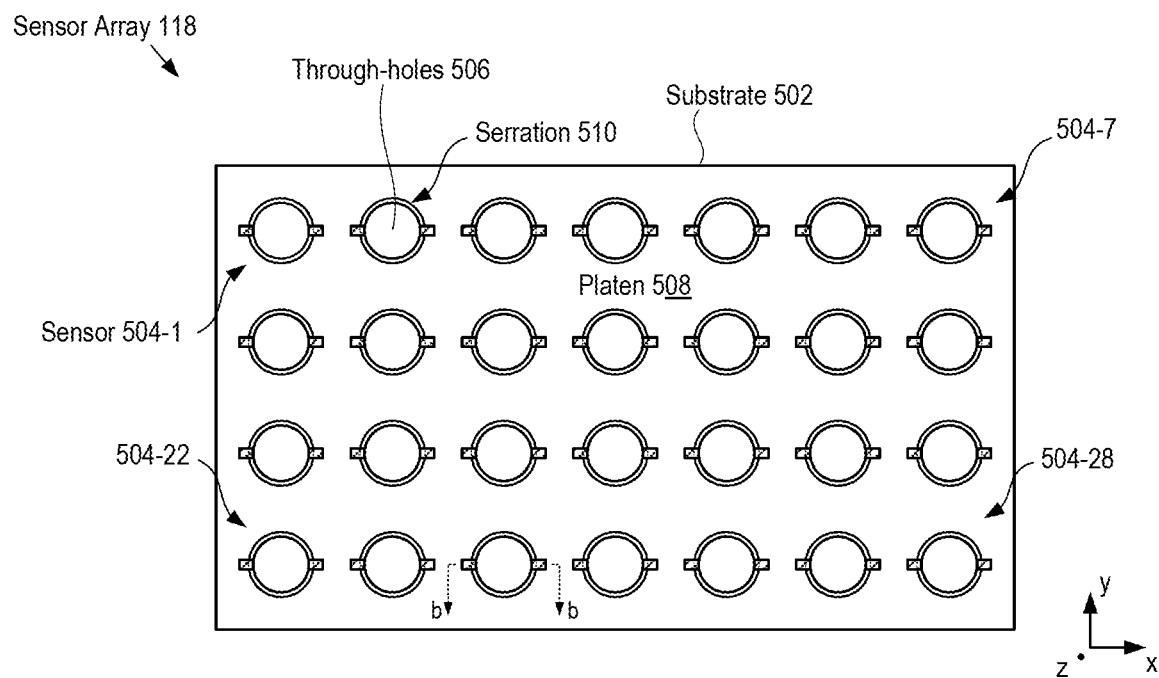
FIG. 5 depicts a schematic drawing of a top view of a sensor array in accordance with the illustrative embodiment.

FIG. 5 depicts a schematic drawing of a top view of a sensor array in accordance with the illustrative embodiment. Sensor array 118 (not shown in FIGS. 3A-C) comprises substrate 502, sensors 504-1 through 504-28, and through-holes 506. Each of the pluralities of sensors and through-holes is arranged in the same arrangement as tablets 128 and dispense holes 320.

Figure 6A:
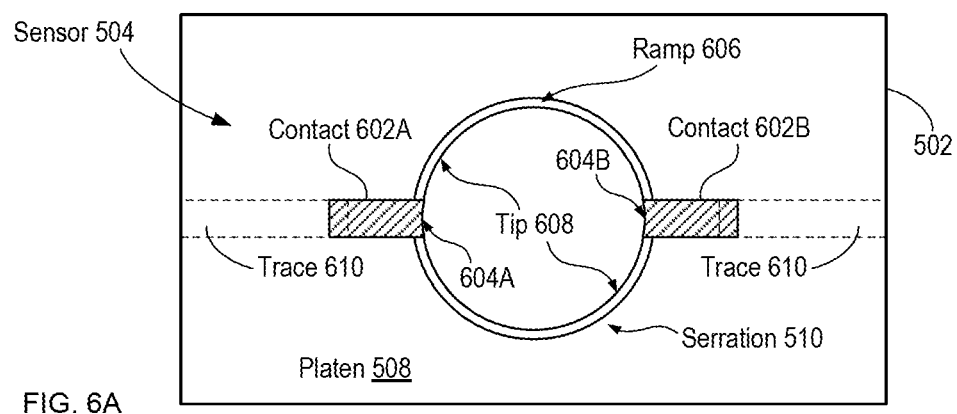
FIGS. 6A-B depict schematic drawings of top and cross-sectional views, respectively, of a representative impedance sensor in accordance with the illustrative embodiment.
Figure 6B:
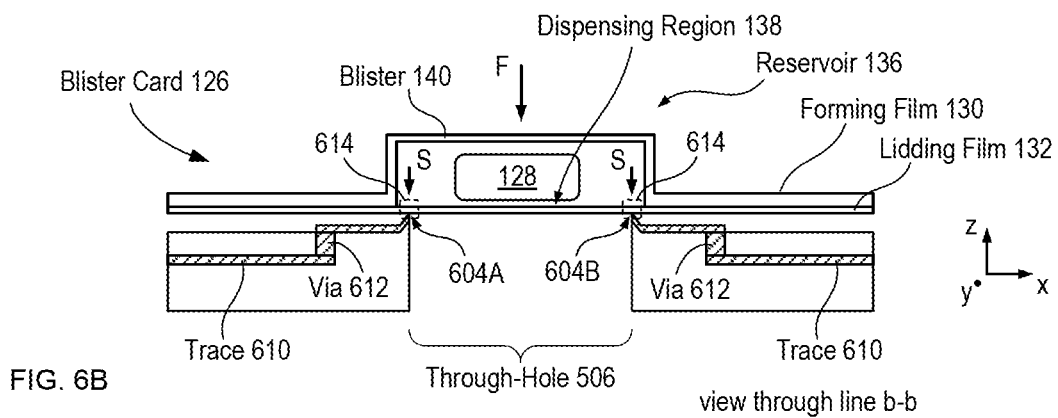

FIGS. 6A-B depict schematic drawings of top and cross-sectional views, respectively, of a representative impedance sensor in accordance with the illustrative embodiment. Sensor 504 is representative of each of sensors 504-1 through 504-28. FIG. 6B depicts sensor 504 as operatively coupled with blister card 126.

Substrate 502 is a substrate suitable for supporting the fabrication of sensors 504-1 through 504-28 (referred to, collectively, as sensors 504). In the depicted example, substrate 502 is a conventional, multi-layer printed-circuit board (PCB). In some embodiments, substrate 502 is a different substrate, such as a semiconductor substrate, ceramic substrate, plate of composite material, and the like. In some embodiments, substrate 502 comprises a flexible material or is incorporated into a different surface of case 100 (e.g., its lid, back surface, etc.) by, for example, embedding components into the material of housing 302, printing electronic elements on the surface itself, and the like. In some embodiments, substrate 502 is incorporated into frame 304. In some embodiments, sensor array 118 is incorporated into lid 318 such that sensors 504 are capacitively coupled with lidding film 132 through forming film 130 when the lid is closed. In the latter two examples, electrical interconnections to substrate 502 accommodate hinged operation of the mechanical component.

The top surface of substrate 502 (i.e., platen 508) functions as a hard surface against which blister card 126 rests. As such, sensor array 118 resides between seat 306 and blister card 126 such that each of sensors 504 is operatively coupled with a different dispensing region 138 of lidding film 132 when the blister card is secured by receiver 116. In some embodiments, sensor array 118 is integrated into seat 306 (i.e., seat 306 also serves as substrate 502).

Each of sensors 504 is an impedance sensor comprising metal traces formed on platen 508. The metal traces terminate at through-hole 506 to define contact points 604A and 604B.

Through-holes 506 are apertures formed through the thickness of substrate 502 to allow for the passage of tablets 128 through detection module 104 when dispensed from blister card 126.

It should be noted that, in the prior art, the lateral stresses that manifest at lidding-film 132 when a blister is being pushed (to dispense a tablet) are relatively low compared to the fracture stress of the lidding film. As a result, the lidding film can deform substantially before any rupture occurs and the magnitude of force that must be applied by the user to induce rupture of the lidding film can be significant. Accordingly, it can be difficult for some users to dispense a tablet from a blister card. This challenge can be particularly acute for some senior citizens, those on other medications (e.g., diabetes, cholesterol, hypertension, etc.), as well as many others.

It is an aspect of the present disclosure, however, that dispensing a product from a blister card can be made easier by concentrating the force applied to a blister into larger localized lateral stresses in the lidding film to initiate fracture. This stress concentration is achieved by including serrations 510 at the inside edge of through-holes 506.

In the depicted example, each serration 510 includes ramp 606, which projects upward from platen 508 to form a continuous sharp edge (i.e., tip 608) around the perimeter of each through-hole.

When force F is applied to tablet 128 through blister 140 (e.g., using a finger, a stylus, etc.), lidding film 132 is pressed against serration 510. This concentrates the force applied to the relatively larger area of blister 140 and tablet 128 at tip 608, which has a relatively smaller area (i.e., pressure region 614). As a result, pressure, S, at lidding film 132 is magnified and easily initiates fracture of lidding film 132 in pressure regions 614. As a result, the magnitude of force F required to initiate fracture of lidding film 306 can be much lower than needed in the prior art.

In some embodiments, at least one of the geometry, number, distribution, and location of serration 510 is defined to effect a desired lidding film fracture at a predetermined magnitude of force F and/or subsequent fracture/tear propagation path. In some embodiments, serration 510 is discontinuous around the perimeter of through-hole 506. In some embodiments, serration 510 has an upper edge that has undulations and/or discrete sharp features that concentrate the applied force into smaller areas of the lidding film.

Typically, the configuration of ramp 606 is selected to provide sufficient cutting capability without sacrificing strength. In some embodiments, ramp 606 is configured such that it creates a stress concentration in lidding film 132 that provides efficient cutting action while also mitigating the potential for injury to the finger of a user as tablet 128 is pushed through the lidding film.

In some embodiments, tip 608 is analogous to the sharp edge of a different cutting element, such as a serrated knife, a saw blade, and the like, or any combination thereof. In other words, in some embodiments, tip 608 includes features having one or more of puncturing and cutting geometries and arrangements used in knives, blades, puncturing tools, and the like. In some embodiments, serration 510 has elements distributed radially from the through-hole 506.

Figure 6C:
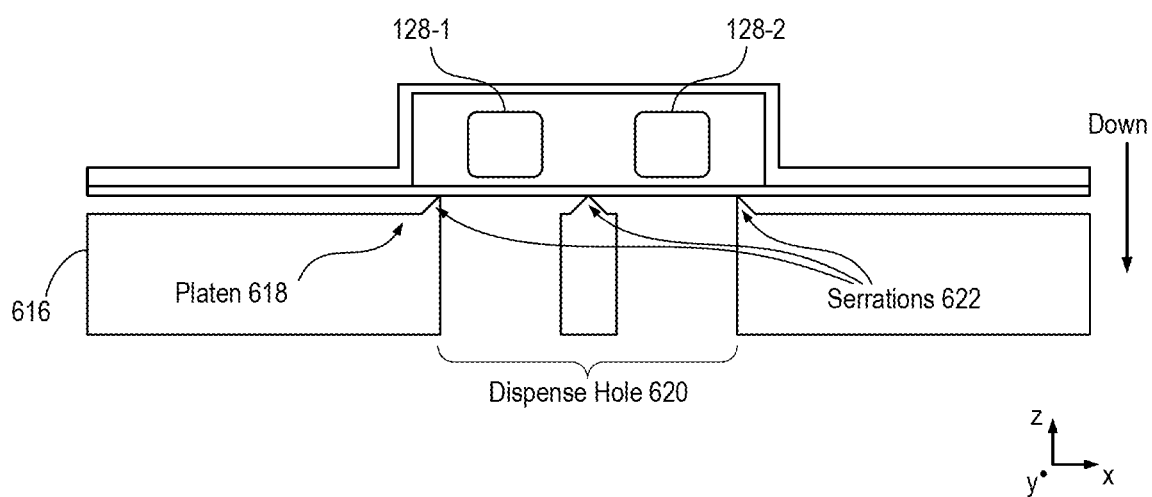
FIG. 6C depicts a case bottom that includes a divided dispense hole in accordance with an alternative embodiment of the present disclosure.

FIG. 6C depicts a case bottom that includes a divided dispense hole in accordance with an alternative embodiment of the present disclosure. Case bottom 616 includes platen 618, dispense hole 620, and serration 622.

In the depicted example, serration 622 is analogous to serration 510 described above; however, serration 622 includes portions that are located around the peripheries of each of the divisions of dispense hole 620.

It should be noted that, in some embodiments, dispense hole 620 is singular (i.e., without divisions) even when a blister site contains more than one tablet.

Figure 6D:
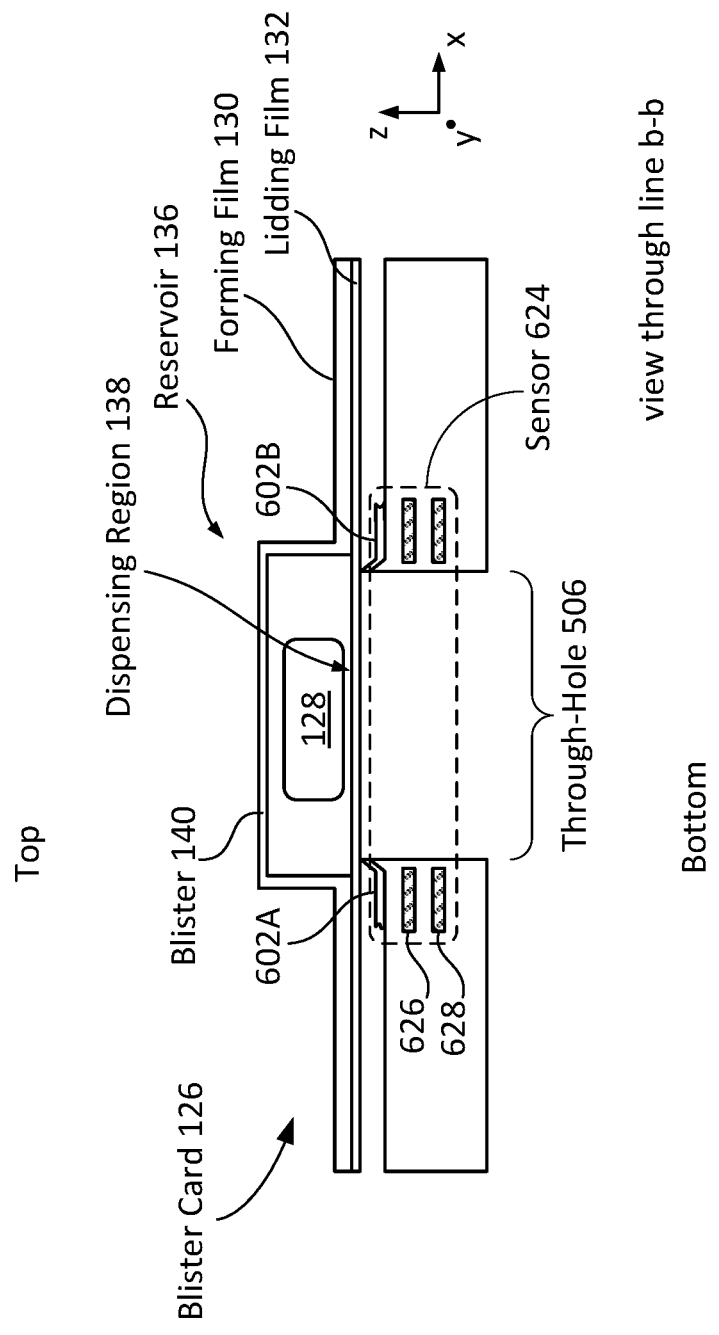
FIG. 6D depicts a cross-sectional view of an alternative sensor in accordance with the present disclosure.

FIG. 6D depicts a cross-sectional view of an alternative sensor in accordance with the present disclosure. Sensor 624 is a capacitive sensor whose output signal is based on the state of dispensing region 138. Sensor 624 includes contacts 602A and 602B, electrode 626, and electrode 628. Sensor 624 is analogous to high-noise-immunity capacitive sensors described in U.S. patent application Ser. No. 15/223,779.

Each of electrodes 626 and 628 is formed within substrate 502 such that it is a planar, circular metal electrode that completely surrounds through-hole 506 and is parallel with platen 508. Electrodes 626 and 628 are formed such that electrode 626 is between lidding film 132 and electrode 628 when blister card 126 is located in receiver 116. In this state, electrode 626 and dispensing region 138 collectively define a capacitor whose capacitance defines the output signal of sensor 624, where the value of its capacitance is based on the state of dispensing region 138.

Contacts 602A and 602B are electrically connection to ground through traces 610 (not shown). As a result, when the blister card is located in the receiver, lidding film 132 is grounded and functions as a ground plane that mitigates the effects of noise and interference on the sensor that originates from the top side of blister card 126. For the purpose of the Specification, including the appended claims, an "electrical shield" is defined as an element that mitigates the effect of stray capacitance, electrical noise, and electrical interference on and electrical parameter measured at another element. It should be noted that sensor 624 can include any practical number of contacts 602 (e.g., one, three, ten, etc.) without departing from the scope of the present disclosure.

In the depicted example, electrode 628 is also electrically connected to ground and, therefore, functions as a group plane that defines another electrical shield, which mitigated the effects of noise and interference on the sensor that originates form the bottom side of blister card 126.

In some embodiments, in order to further mitigate the effects of noise and interference, at least one of electrodes 626 and 628 is segmented into a pair of half-rings. In some embodiments, at least one of electrodes 626 and 628 is segmented into more than two circumference sections. In some embodiments, an electrically grounded shield line is formed in the plane of electrode 626, where the shield line substantially surrounds the electrode, thereby functioning as a third electrical shield that mitigates the effects of laterally directed noise and interference of the sensor.

It should be noted that the blister plastic and the lidding aluminum films have very different material and structural properties. The blister is far more resistant to puncture and tear than the lidding film. Typically, therefore, serrations can be designed to puncture and tear the lidding film without significantly damaging the blister, which enables a user to safely push a pill through its blister without risking injury to their fingers.

At operation 408, electronics module 102 transmits status signal 122 to external device 120. Status signal 122 includes the status of dispensing regions 138, as well as the date and time at which smart case 100 was opened. In some cases, status signal 122 includes an indication of a change in one or more of the dispensing regions from their condition at the most recent previous determination of their states. If the external device 120 is not in range, the status signal is stored in memory 212 and transmitted to external device 120 at some point in the future when external device 120 is in range.

In some embodiments, a stylus for applying force to a blister is included to further ease the process of dispensing a tablet.

Figure 7:
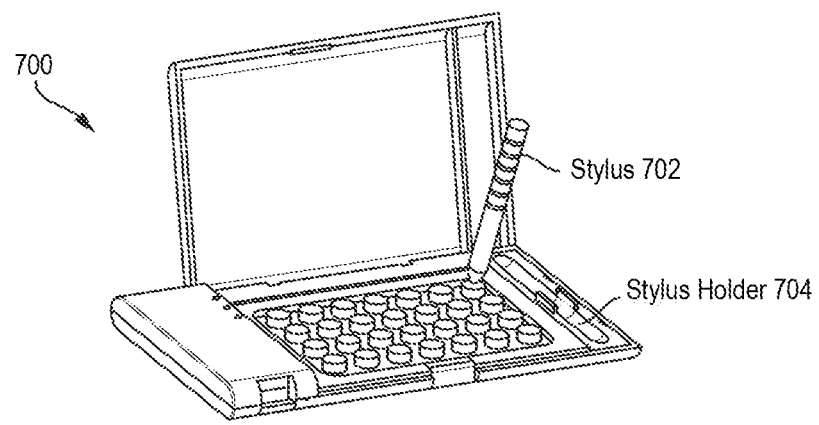
FIG. 7 depicts a schematic drawing of a non-modular smart case that includes a stylus for applying force to a blister of a blister card.

FIG. 7 depicts a schematic drawing of a non-modular smart case that includes a stylus for applying force to a blister of a blister card. Case 700 is analogous to case 100; however, case 700 includes stylus 702 and stylus holder 704, which holds stylus 702 in the case when it is not in use.

Figure 8:
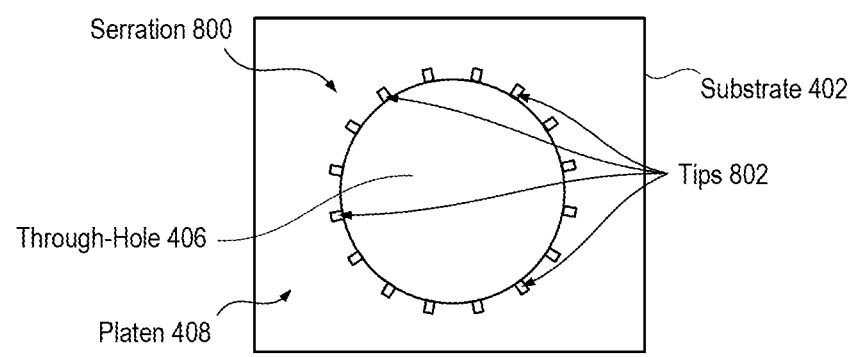
FIG. 8 depicts a schematic drawing of a top view of an example of an alternative serration in accordance with the present disclosure.

FIG. 8 depicts a schematic drawing of a top view of an example of an alternative serration in accordance with the present disclosure. Serration 800 includes a plurality of discrete tips 802, which are arranged around the perimeter of through-hole 506.

Each of tips 802 is a sharp projection that concentrates puncture stresses into smaller regions of lidding film 132. One skilled in the art will recognize, after reading this Specification, that tips 802 can have myriad configurations over one or more similar or differing arc-segments of the periphery of through-hole 506. For example, including only one tip 802 at the periphery of through-hole 506 will give rise to the lidding film being punctured at its location, where tearing of lidding film 132 will initiate. Discrete serrations, such as serration 800, can also incorporate puncturing and cutting geometries and arrangements used in knives, blades, puncturing tools, and the like.

It should be noted that puncturing of the lidding film can be initiated at one or more locations and the subsequent tearing of the lidding film can then be guided through relative placement of other tips 802 along an arc or (extrapolated) radius of through-hole 506 periphery. For example, a single point of puncture by an individual cone- or pyramid-shaped serration tip can be located at the periphery of through-hole 506, while additional, shorter serration tips can be located to one or the other (or both) side(s) of the individual tip over a desired arc length. The taller individual point will effect puncture of the lidding film as pressure/force is applied to blister 140. After this initial puncture, the remaining shorter serrations will give rise to tearing of the lidding film in their direction.

Furthermore, serration tips may be placed in locations that are located radially away from the periphery of through-hole 506, including in combination with others at the periphery of through-hole 506. Such design flexibility enables additional degrees of freedom in initiating and propagating tearing of the lidding film. By way of example, a ring of serrations placed away from through-hole 506 periphery—but still under the blister site's lidding film membrane when the through-hole 506 is smaller than dispensing region 138 but large enough to allow tablets 128 through—will result in tearing of a larger area of lidding film 132.

Alternatively, serration tips can be located at radially opposite sides of a through hole such that the serrations radially emanate away from the through hole, which will drive tearing of the lidding film along the line along the opposing radial serrations. By moving the opposing radial serrations off center with respect to the through-hole's center, the tear across will move off center correspondingly.

One skilled in the art will recognize, after reading this Specification, that myriad combinations of geometry, number, distribution, and location of serration tips and/or serrations exist for driving specific goals in initiating and propagation tearing of the lidding film. Furthermore, serrations/tips located at the periphery of a dispense hole may be fabricated in the plane of the hole or at any angle to it. There are also myriad of ways to fabricate these serrations, including from hard plastics, glass, metal, ceramic, and the like. For example, the serrations may be realized as part of the fabrication of the surface of seat 306 on which the blister card rests. This surface may be the inside surface of the bottom structure of the smart case itself, when this bottom structure also incorporates the sensing provisions. Alternatively, the serrations may be fabricated as part of a separate surface upon which the blister card rests—with this new surface resting on seat 306 or a PCB incorporating the sensing provisions and also constituting seat 306. In some embodiments, the serrations are fabricated onto the surface of a PCB that includes the sensing provisions and also constitutes platen 508. Alternatively, serrations/tips may be fabricated separately and assembled onto any such platen.

Returning now to FIGS. 5-6, sensor 504 includes contacts 602A and 602B, which are metal traces formed on the top surface (i.e., platen 508) of substrate 502. Contacts 602A and 602B terminate at through-hole 506 to define contact points 604A and 604B, which reside on serration 510.

The state of dispensing region 138 is determined by measuring the resistance between contact points 604A and 604B when they are in physical and electrical contact with lidding film 132. It should be noted that the increased pressure realized by virtue of serration 510 also improves the electrical connection between contact points 604A and 604B and lidding film 132.

Electrical connection between contact points 604A and 604B and electronic circuitry 112 is established by connecting contacts 602A and 602B to traces 610 and vias 612, which are metal features formed within the body of substrate 502 in conventional fashion.

Although the illustrative embodiment includes sensors that measure the resistance across their respective dispensing regions using two contact points, in some embodiments, the impedance of a dispensing region is measured using a sensor having a different number of contact points, each of which is electrically connected to measurement electronics (e.g., electronic circuitry 112, located on substrate 502, etc.) via contacts, vias, and traces, as described above.

Figure 9A:
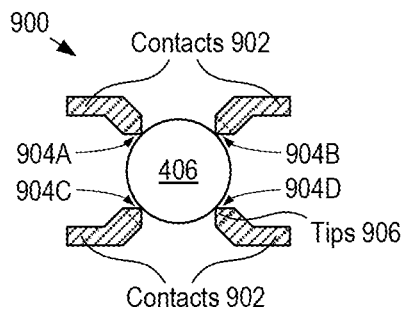
FIGS. 9A-C depict schematic drawings of top views of alternative arrangements of contact points in accordance with the present disclosure.
Figure 9B:
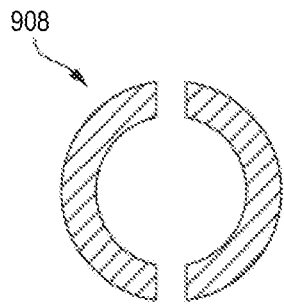
Figure 9C:
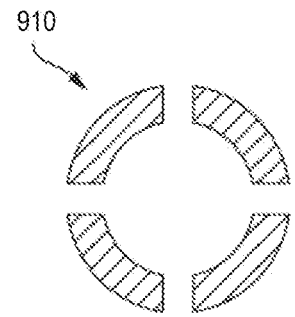

FIGS. 9A-C depict schematic drawings of top views of alternative arrangements of contact points in accordance with the present disclosure.

Arrangement 900 includes four contacts 902, which terminate at through-hole 506 at contact points 904A, 904B, 904C, and 904D.

Contacts 902 are analogous to contacts 602A and 602B described above and are configured such that contact points 904A, 904B, 904C, and 904D are distributed around through-hole 506 in a substantially square arrangement. The arrangement of contact points 904A, 904B, 904C, and 904D enables four-point probe measurement of dispensing region 138, as well as other impedance measurement techniques.

In the depicted example, each of contact points 904A, 904B, 904C, and 904D is disposed on a tip 906, which are each analogous to tips 702 described above.

Arrangement 908 is an alternative contact arrangement that enables simple impedance measurement of dispensing region 138.

Arrangement 910 is an alternative contact arrangement that enables simple impedance or, alternatively, four-point probe measurement of dispensing region 138.

It should be noted that the contact and contact point shapes and arrangements shown in FIGS. 9A-C represent only a few examples of alternative arrangements of contacts, contact points, and serration tips in accordance with the present disclosure. The shape, size, number and arrangement of contacts, contact points, and/or serration tips can be selected to realize a wide range of desired sensing sensitivity and reliability, as well as sensing power consumption considerations.

It should be noted that, in some embodiments, blister card 126 includes an electrically insulating layer (e.g., cardboard, plastic, etc.) that resides over the exposed surface of lidding film 132. In such embodiments, contacts 602, as well as connectors 336, are not in direct physical and electrical contact with lidding film 132 when blister card 126 is located in detection module 104. In such cases, contacts 602 and connectors 336 are capacitively coupled with the lidding film.

Although sensor array 118 employs impedance-sensing technology to monitor the state of blister card 126, many alternative sensing technologies can be employed in detection module 104 without departing from the scope of the present disclosure. Sensing technologies suitable for use in embodiments in accordance with the present disclosure include, without limitation, capacitive sensing, strain sensing, optical sensing, acoustic sensing, tactile sensing, thermal sensing, and magnetic sensing, among others.

Furthermore, in some embodiments, the state of a region within lidding film 132 is determined by imaging the region via electrical impedance tomography (EIT) rather than simple direct impedance measurement. Using EIT, the resistance (or impedance) distribution within the region can be determined via a plurality of connectors arranged about at least a portion of the periphery of the region.

Figure 10:
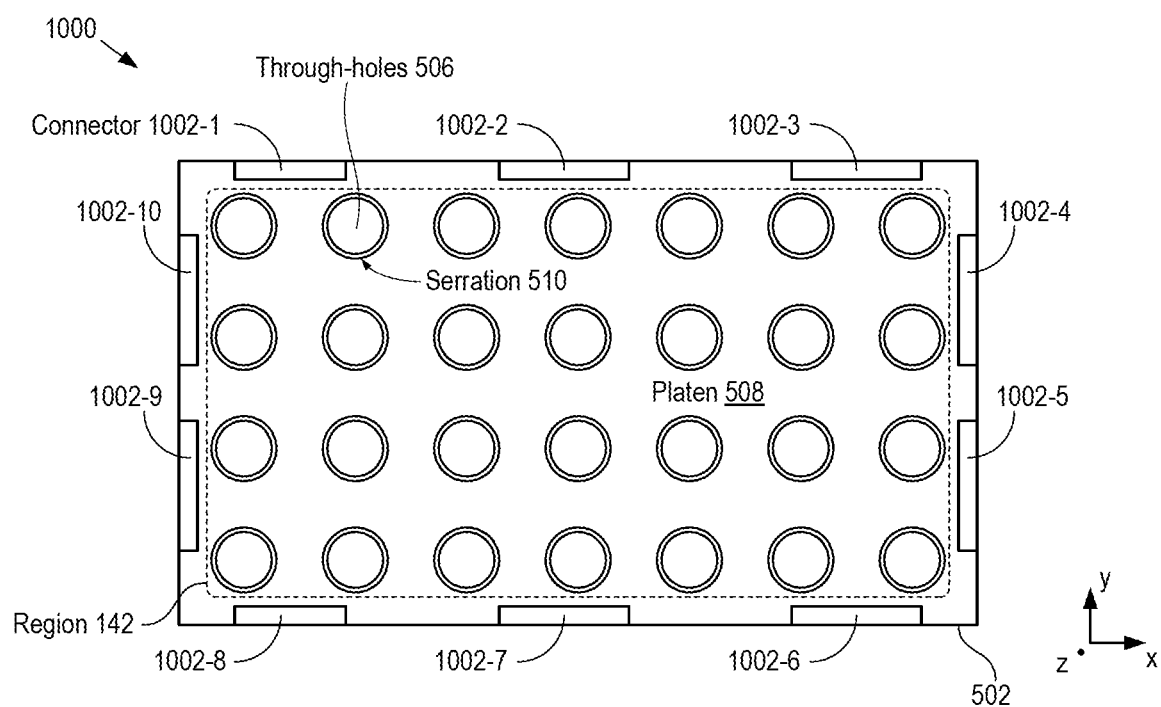
FIG. 10 depicts a schematic drawing of a cross-section of a sensor array configured to monitor the state of a blister card via electrical impedance tomography.

FIG. 10 depicts a schematic drawing of a cross-section of a sensor array configured to monitor the state of a blister card via electrical impedance tomography. Sensor array 1000 includes connectors 1002-1 through 1002-10, which are arranged around the perimeter of substrate 502. It should be noted that any number and areal distribution (i.e., distribution over the area of blister card 126) of connectors can be used in sensor array 1000 without departing from the scope of the present invention. In some embodiments, sensing of aggregate resistance changes of the card's lidding film is measured by only have two connectors—on opposing sides—to determine if and how many tablets are dispensed.

Each of connectors 1002-1 through 1002-10 (referred to, collectively, as connectors 1002) is analogous to connectors 336 described above and with respect to FIGS. 4A-D; however, connectors 1002 are configured to enable insertion of blister card 126 into seat 306 without significant deformation of the blister card. In some embodiments, connectors 1002 are "zero-insertion-force" (ZIF) connectors that close over the blister card after it has been inserted.

In some embodiments, connectors 1002 are metal bumps on the surface on which blister card 126 rests. In some embodiments, such metal pumps are shaped as needles/probe tips that pierce blister card 126, making electrical contact to the blister card's lidding film and, at the same time, securing the blister card in place mechanically. In such embodiments, electrical contact to the lidding film would not be affected by out of plane movement of the blister card. At the same time, the protrusion of needle/probe-like connectors 1002 through the laterally stiff/tear-resistant forming film secures the blister card laterally.

As will be appreciated by one skilled in the art, electrical impedance tomography imaging and electrical resistance tomography (ERT) imaging (a.k.a., electrical resistance imaging (ERI)) are well-known techniques used for imaging tissue in medical applications, as described by Duraiswami, et al., in "Efficient 2D and 3D EIT using dual reciprocity boundary element techniques," *Engineering Analysis with Boundary Elements*, Vol. 22, pp. 13-31 (1998), and elsewhere. In such approaches, a forward model of a system is first developed by modeling the system for a plurality of potential configurations of a parameter of interest. These modeled configurations are then stored in a look-up table. An unknown parameter configuration is then reconstructed by making measurements of the system, whose results are then compared to those predicted by the stored models. Typically, an iterative algorithm is used in doing so, identifying features of interest in the measured system.

To develop an image of region 142 of lidding film 132 within using EIT, pair-wise measurements of the impedance between pairs of connectors 1002 are made by generating an electric stimulus (in the present example, an electric current) between a first pair of connectors that serve as the current source and sink. The voltage potential between each other pair of terminals is then measured to determine the potential difference between their respective locations. In such embodiments, for a system with N terminals there are approximately $N^4$ different terminal configurations. Such pair-wise measurements are analogous to ERT methods described by LaBrecque in U.S. Pat. No. 8,733,432 and EIT measurements described by Duraiswami, et al., in "Efficient 2D and 3D EIT using dual reciprocity boundary element techniques," each of which is incorporated herein by reference.

For example, LaBrecque discloses, " . . . in ERT, each measurement uses four electrodes; one pair of electrodes serves as the current source and sink and a second pair measures the potential difference between two points. For a system with N electrodes there are approximately $N^4$ different configurations referred to as arrays." In similar fashion, Duraiswami discloses, "In electrical impedance tomography (EIT) the distribution of impedances inside an object ('image') is sought by applying specified currents at some electrodes, and performing measurements of the voltage at other electrodes. The equations for the electric field then provide a relationship between the impedance distribution inside the medium and the measured voltages and applied currents. Different kinds of materials have different impedances, and the availability of an impedance map provides an image of the material Distribution." One skilled in the art will recognize that ERT and EIT measurements, such as those described by LeBrecque and Duraiswami, are suitable for use in embodiments of the present invention.

Figure 11:
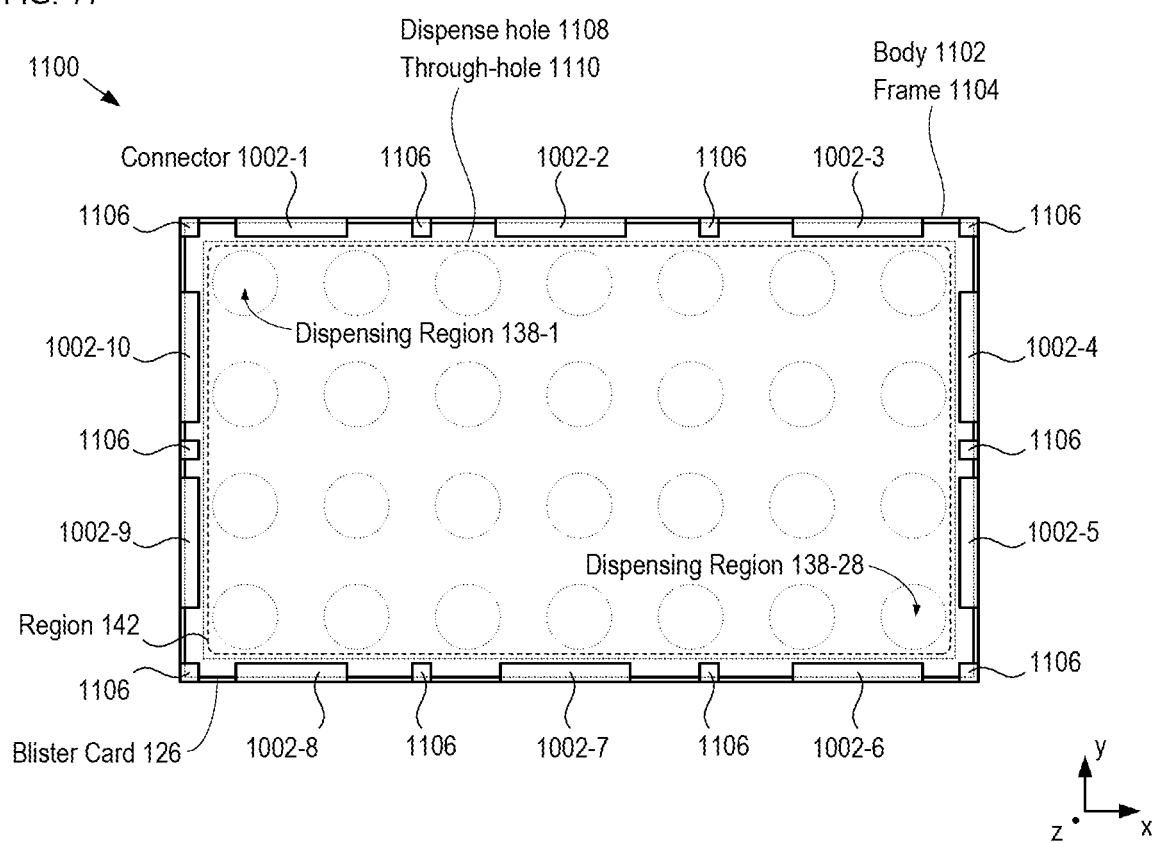
FIG. 11 depicts a schematic drawing of a top view of an alternative smart case in accordance with the present disclosure.

FIG. 11 depicts a schematic drawing of a top view of an alternative smart case in accordance with the present disclosure. Smart case 1100 includes body 1102, frame 1104, connectors 1002-1 through 1002-10, and anchors 1106. Smart case 1100 is depicted as operatively coupled with blister card 126.

Body 1102 is analogous to body 316 described above; however, body 1102 is a rectangular annulus having a single central opening that defines a single dispense hole 1108. Dispense hole 1108 is analogous to each dispense holes 320 described above. In the depicted example, dispense hole 1108 is large enough to extend completely around region 142 of blister card 126.

Frame 1104 is analogous to sensor array 118 described above; however, frame 1104 is a rectangular annulus of structural material having a single central opening (i.e., through-hole 1110) and does not include individual sensors at each dispense region of blister card 126. In the depicted example, through-hole 1110 is the same size as dispense hole 1108. As a result, dispensing regions 138-1 through 138-28 (indicated by dashed-line circles) all reside within the perimeter of each of dispense hole 1108 and through-hole 1110.

In some embodiments, at least one of body 1102 and frame 1104 includes ribs along the x- and/or y-directions (or other directions) that define a plurality of sub-openings within the central opening of their annuli. Typically, each such sub-opening is large enough to surround more than one tablet region of blister card 126. As a result, the different portions of the blister card would be analogous to a plurality of "diaphragms," each suspended over a different sub-opening.

Each of anchors 1106 is a fastener that holds a different portion of blister card 126 and disables lateral motion of that portion. In the depicted example, each anchor 1106 is a pin that pierces both lidding film 132 and forming film 130. In some embodiments, at least one of anchors 1106 is a different type of fastener, such as a screw, a clamp, and the like.

Anchors 1106 mitigate lateral motion and/or buckling of the unsupported portion of blister card 126 when force is applied to one or more blisters 140.

It should be noted that, in embodiments wherein body 1102 and/or frame 1104 define(s) a plurality of sub-openings, anchors 1106 may be additionally or exclusively located along the perimeter of each of the sub-openings to affix the edge of each of the "diaphragms" in place.

In some embodiments, the functionality of each of connectors 1004 and anchors 1106 is combined into a single element that both fastens a portion of the blister card in place and makes electrical contact with the lidding film at the location of the element.

In some embodiments, frame 1104 is not included and connectors 1002 are disposed directly on body 1102.

In some embodiments, connectors 1004 are disposed on a separate substrate that functions as a platen as described above and with respect to substrate 502 of sensor array 118.

In some embodiments, anchors 1106 are located on the surface of body 1102 against which blister card 126 rests, piercing through blister card 126 from the lidding film side. In some embodiments, anchors 1106 are located on the underside surface of frame 1104, piercing through blister card 126 from the forming film side. In embodiments that include a platen, anchors 1106 are located on the surface of the platen against which blister card 126 rests, piercing through blister card 126 from the lidding film side.

It should be noted that, in some embodiments, more than one pill is included within a single blister site on a blister card.

Accommodating "Peel-Away" Blister Cards

Some blister cards are designed to make them more child proof using a multi-layer lidding film that is more difficult to rupture or tear. Typically, the layers include a metal foil (e.g., aluminum) on the inside, paper on the outside, and a thin polymer layer sandwiched in between the metal and paper. Such blister cards are referred to herein as "peel-away" blister cards. Typically, in a peel-away blister card, peeling the lidding film off is a central step to dispensing the content of a blister—rather than pushing the tablet through the composite lidding film.

Embodiments in accordance with the present disclosure are suitable for use with peel-away blister cards. In such cases, however, the blister card is typically removed from the case to facilitate opening the desired blister site to dispense its content. Once the content has been dispensed, the blister card is re-inserted into the smart case. It should be noted that, since the blister content is not pushed through the case bottom, inclusion of dispense holes 320 and through-holes 506 is optional.

In some cases, peel-away blister cards include perforation lines to facilitate removal of a segment of the card corresponding to a dose. Once a dose portion is separated, the user peels off its lidding film to access its blister content. Each time a dose is dispensed, the user discards the corresponding segment of the blister card. In other words, the blister sites and their corresponding perforated segments vanish with each dose—leaving a smaller portion of the card behind. Accordingly, when a user removes the card from the case, separates a segment, and places the remainder of the card in the case, the change in the card can be detected by the case. In such cases, the separated segment may be thought of as an empty blister site void of any lidding film.

Accommodating Medication Packages Other than Blister Cards

One skilled in the art will appreciate that a flat, rectilinear content compartment can be considered a special shape of a bottle, vessel, vial, tub, tube, pouch, can, cartridge, and the like. Accordingly, the use of the smart case is not limited to blister-card formats and a content compartment might contain loose pills, liquids, gels, syrups, suspensions, powders, pastes, creams, strips, vapor, spray, and the like. Depending on the electrical properties of the medication content (e.g., dielectric or conductive), the EIT sensing techniques described above, as well as a variation of EIT sensing, namely, electrical capacitance tomography (ECT) sensing, can be used to monitor the state of the content.

ECT is used to determine the distribution of the content of a vessel by measuring the related permittivity distribution through the volume of the vessel. ECT is most successful when applied to materials of low electrical conductivity. The requisite capacitance measurements are achieved by using a plurality of connectors that surround at least a portion of the volume to be imaged, as depicted in FIG. 10 above. In some embodiments, a region to be imaged is surrounded by one or more circumferential sets of connectors and the electrical capacitances between all combinations of the connectors within each set are measured. This information is then used to construct an image of the content of the cross section of the vessel enclosed by the connectors, based on variations in the permittivity of the material inside the vessel.

In some embodiments, a content compartment does not include dispense holes and a receiver but is, instead, a single large reservoir that contains loose pills. In such embodiments, ECT techniques can be used to count the number of and determine the shape/features of the pills (i.e., in case of a mix of different medicines) to monitor when pills are added or removed, as well as how many and which pills. The necessary connectors would be fabricated in the walls of the content compartment, themselves lined with or comprising of a dielectric material (e.g., plastic, glass, etc.). The same would apply to any other dielectric content, e.g., gel, powder, cream, paste, strip, and the like. If the product included in a content compartment is electrically conductive, EIT techniques can be used.

A pancake-like geometry of a content compartment enables simple, parallel-plate capacitive sensing to be used with loose product units, such as pills. When the lid of the case is closed, a foil or thin-film metal electrode fabricated to span the inside surface of the lid creates a large parallel-plate capacitor with a similar electrode fabricated on the inside surface of the bottom structure of the smart case or a PCB thereupon, depending on where the sensing provisions are implemented. Each time a portion of the content is removed, the dielectric constant in the gap formed by the two electrodes changes. This change can be related to the amount of content removed. The parallel-plate capacitor so formed may be segmented into smaller, sub-area parallel-plate capacitances for locational information regarding the content. The electrical shielding considerations described earlier in this application are similarly applicable here.

The content compartment lid may be implemented in a variety of different ways to facilitate different uses and functionalities without departing from the scope of the present invention. For example, the lid may be subdivided to two or more lids to discretize access to the content compartment. It may be located on the side of the case's content compartment, for example when a pancake-like bottle is desirable. The lid may use a sliding hinge rather than a rotational hinge. It may be implemented as a cap that snaps on/off or screws on/off. In other words, "lid" signifies a means of accessing the content compartment.

Embodiments in which product units within a content compartment are granular (e.g., loose pills) are afforded particular advantages over the prior art by the teachings of the present disclosure. In some applications, it is desirable to self-assemble the product units into corresponding sites in the content compartment to simplify sensing them. If there is a mix of different shape, size, and/or weight pills, it can be desirable to sort them accordingly. These capabilities allow a user to simply pour the pills into the content compartment, rather than place the pills into specific sites.

For certain content types, such as liquids, suspensions, vapor, spray, and the like, a content compartment is adapted accordingly. For example, vapors require the compartment to comprise of flexible top and bottom walls and a dispense nozzle. Dispensing is accomplished by squeezing the compartment to dispense the vapor droplets through the nozzle—analogous to a nasal spray, for example. Alternatively, a content compartment can be configured such that it resembles a spray can, wherein dispensing is accomplished through a spray head incorporated on the case and connected to the pressurized content compartment.

A smart pill case in accordance with the present disclosure can be similarly adapted for use with liquids, suspensions, and alike. Furthermore, medications housed in the compartments may be prepackaged, like blister cards. For example, a vapor (e.g., a nasal spray, etc.) can be contained in its own packaging, or a content compartment can be shaped and provisioned to house a medicinal cartridge (e.g., a traditional inhaler, etc.).

In some embodiments, a content compartment is flexible, thereby enabling its content (e.g., vapor, cream, past, gel, etc.) to be dispensed by squeezing the content compartment itself. In some such embodiments, sensing of the dispensing events is monitored by placing strain-sensitive electrical elements inside or on (one or more) surfaces of one or more of the flexing compartment walls, e.g., top and bottom walls of the content compartment.

Depending upon the application and the product to be dispensed, in some embodiments, a content compartment is reusable or disposable. In some embodiments, the entire case is disposable.

Providing for housing multiple pills in a dispense site is beneficial for medication synchronization, which in turn improves adherence for those on multiple medications. A chronic disease patient may be on several different pills for example. Placing all of the pills into a site—if they are dosed similarly—helps the patient dispense a dose of each simultaneously. If the different pills are dosed differently, they can be sorted into different sites. The case would be programmed correspondingly to accommodate the different dosing required. In all of these scenarios, the patient on multiple medications needs to carry only one case—a significant convenience.

Alternatively, cold-seal blister cards can be used for medication synchronization. These cards are common for dosing of medication by the user or by specialty pharmacies. The desired content is places inside each blister site, with the blister plastic tray rested on a surface bottom-side up. The lidding film is then adhered onto the blister tray. The implementation is usually push-through format. Such cold-seal blister cards and the like can be used to dose a variety of medication into a blister card package format, which can then be used in the smart case. The same would apply for blister cards manufactured by other blister card packaging processes.

Labeling

Labeling of the content of the case may be necessary when the content itself is not labeled. Such labeling may be: (i) printed on removable adhesive paper to be placed on the case or on the inside surface of the lid or on receiver; and/or (ii) in sleeves or tabs on such surfaces for non-adhesive, printed labels. Alternatively, the labeling may be accomplished with an electronic display positioned analogously. Another approach is to rely on pairing of the case with a corresponding app on a smart phone (or the like) to read the label in the app instead.

Medication Synchronization

As discussed above, for cases in accordance with the present disclosure in which the medication package format is that of "push through," dispense holes are included. For embodiments in which loose pills are sorted into individual sites (either manually or by self-assembly), however, such dispense holes would enable the pills to fall through the case bottom. In such embodiments, therefore, dispense holes 320 include barriers, such as flaps, which function as a Reed-type check valve. Such barriers can be incorporated in case body 316 or substrate 502, or as a separate member.

In some embodiments, dispense hole 320 is sealed by a thin diaphragm that includes a pre-cut incision (e.g., a plus "+" sign, etc.). A plus sign, for example, gives rise to two orthogonal diameters of the diaphragm, forming four identical pie-shaped flaps. The mechanical properties of the valve (and the compliance of the flaps) can be design to specification by the dispense hole size and geometry, and the number and geometry, thickness, and materials of the flaps. Accordingly, the valve can be designed to allow a pill to be pushed through at a predetermined level of pressure/force, while securely preventing the pill from falling through the dispense hole under its own weight.

The foregoing check-valve concept provides for reusable sites into which one or more pills can be placed to be dispensed by pushing them through when they must be dispensed. The contents of a site can be pushed through by applying pressure/force directly onto it. This pressure/force may be produced for example by one's finger or a stylus directly on the content. Alternatively, the sites may be covered by a receiver whose corresponding site holes comprise elastically deformable membranes that isolate the pressure/force source from touching the content. The receiver may be intended to additionally aid in securing the contents of sites in place. The receiver may be reusable or disposable depending on the application and need.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A smart case (100) for monitoring the state of a blister card (126) that includes a forming film (130), a lidding film (132) that includes a first region (142) that is electrically conductive and unpatterned and includes a plurality of dispensing regions (138) within the first region, and a plurality of tablets (128) contained in a. plurality of reservoirs (136) that is arranged in a first arrangement, each reservoir being defined by the forming film and a different dispensing region of the plurality thereof, wherein the case comprises:
   (1) an electronics module (102): and
   (2) a detection module (104) that includes:
      (i) a housing (302) having a lid (318) and a body (316), wherein the lid is movable relative to the body: and
      (ii) a receiver (116) that includes a frame (304), a seat (306), and a plurality of connectors (336) that are electrically connected with the electronics module when the electronics module and detection module are operatively coupled, the receiver being configured to removably locate the blister card such that the lidding film and connectors are electrically coupled;
   wherein the electronics module includes electronic circuitry (112) that is configured to measure a first electrical parameter across at least a portion of the first region when the blister card is located in the receiver the first electrical parameter being selected from a group consisting of resistance and impedance.

2. The case of claim 1 wherein the receiver further includes a sensor array that includes:
   a first through-hole (506-1) and a first sensor (504-1) having a first contact (602A-1) and a second contact (602B-1); and
   a second through-hole (506-2) and a second sensor (504-2) having a third contact (602A-3) and a fourth contact (602B-4);
   wherein the first sensor is configured to measure the first electrical parameter across at least a portion of a first dispensing region (138-1) via the first and second contacts when the blister card is located in the receiver; and
   wherein the second sensor is configured to measure the first electrical parameter across at least a portion of a second dispensing region (138-2) via the third and fourth contacts when the blister card is located in the receiver.

3. The case of claim 2 wherein the first contact includes a first contact point (604A) and the second contact includes a second contact point (604B), each of the first and second contact points being in electrical communication with the lidding film when the blister card is located in the receiver.

4. The case of claim 3 wherein at least one of the first and second contact points is capacitively coupled with the first dispensing region.

5. The case of claim 3 wherein the first through-hole includes a serration (510) that comprises a tip (608) that is configured to initiate puncture of the lidding film in the first dispensing region in response to application of a force, F, applied to a blister (140), and wherein at least one of the first and second contact points is disposed on the tip.

6. The case of claim 1 wherein the plurality of connectors is arranged around at least a portion of the perimeter of the first region and the first impedance is measured between first and second connectors of the plurality thereof, and wherein the electronic circuitry is configured to generate an impedance map of the first region via a measurement technique selected from a group consisting of electronic impedance tomography and electronic resistance tomography.

7. The case of claim 6 wherein the electronic circuitry is configured to generate the impedance map by (1) providing an electrical stimulus between a first connector and a second connector of the first plurality thereof and (2) making pair-wise measurements of an electrical parameter between each connector of a second plurality of connectors that is exclusive of the first and second connectors, and wherein the first plurality of connectors includes the second plurality of connectors, and further wherein the electrical stimulus is one of current and voltage and the electrical parameter is the other one of current and voltage.

8. The case of claim 6 wherein the body (1102) includes a dispense hole (1108) that is at least as large as the first region.

9. The case of claim 1 wherein at least one of the electronics module and detection modulation includes a biosensor (348) that is configured to measure a user parameter selected from a group consisting of bio-impedance and bio-potential.

10. The case of claim 1 wherein at least one of the electronics module and detection modulation includes a camera (346) configured to acquire an image, and wherein the electronic circuitry is configured to unlock the case and enable relative motion between the lid and the body based on the acquired image.

11. The case of claim 1 further comprising:
(3) an electrical interface that is configured to reversibly electrically couple the electronics module and the detection module; and
(4) a mechanical interface that is configured to reversibly mechanically couple the electronics module and the detection module.

12. The case of claim 1 wherein the housing has an open state that enables access to the plurality of reservoirs and a closed state that prevents access to the plurality of reservoirs, and wherein the housing includes:
a catch (326) and a clasp (322), wherein at least one of the catch and clasp is electronically actuatable; and
wherein the catch and clasp are configured to (1) engage and hold the housing in the closed state when the at least one of the catch and clasp is unactuated and (2) disengage and enable the open state when the at least one of the catch and clasp is actuated.

13. The case of claim 12 further including at least one of a camera (346) and a sensor (348) that is configured for at least one of: (1) performing a user authentication, (2) actuating the at least one of the catch and clasp when user authentication succeeds, and (3) issuing an alert when user authentication fails.

14. The case of claim 1 wherein the receiver further includes a sensor array that is configured to determine the state of each dispensing region of the plurality thereof, and wherein the sensor array includes:
a first through-hole (506-1) having a first serration (510-1) that comprises a first tip (608-1) that is configured to initiate puncture of the lidding film in a first dispensing region (138-1) of the plurality thereof in response to application of a force (F) to a first blister (140-1); and
a second through-hole (506-2) having a second serration (510-2) that comprises a second tip (608-2) that is configured to initiate puncture of the lidding film in a second dispensing region (138-2) of the plurality thereof in response to application of the force to a second blister (140-2).

15. The case of claim 14 wherein the sensor array includes at least one sensor that is selected from a group consisting of a capacitive sensor, a strain sensor, an optical sensor, an acoustic sensor, a tactile sensor, a thermal sensor, and a magnetic sensor.

16. A method for monitoring the state of a blister card (126) that includes a forming film (130), a lidding film (132) that includes a first region (142) that is electrically conductive and unpatterned and includes a plurality of dispensing regions (138) within the first region, and a plurality of tablets (128) contained in a plurality of reservoirs (136) that is arranged in a first arrangement, each reservoir being defined by the forming film and a different dispensing region of the plurality thereof, wherein the method comprises:
(1) locating a blister card in a receiver (116) that includes a frame (304), a body (316), and a plurality of connectors (336), wherein the blister card is located in the receiver such that each connector of the plurality thereof is electrically coupled with the lidding film;
(2) measuring a first impedance across at least a portion of the first region; and
(3) transmitting a status signal (122) that is based on the measured first impedance.

17. The method of claim 16 further comprising performing a user authentication, wherein the user authentication is based on a physical trait of the user, the physical trait being selected from a group consisting of an image of the user and a fingerprint pattern of the user.

18. The method of claim 16 further comprising (4) providing the plurality of connectors such that they are arranged around at least a portion of the first region, wherein the first impedance is measured between first and second connectors of the plurality thereof.

19. The method of claim 16 further comprising:
(4) providing the plurality of connectors such that they are arranged around at least a portion of the first region; and
(5) generating an impedance map of the first region via a measurement technique selected from a group consisting of electrical impedance tomography and. electrical resistance tomography.

20. The method of claim 19 wherein the impedance map is generated by (1) providing an electrical stimulus between a first connector and a second connector of the first plurality thereof and (2) making pair-wise measurements of an electrical parameter between each connector of a second plurality of connectors that is exclusive of the first and second connectors, and wherein the first plurality of connectors includes the second plurality of connectors, and further wherein the electrical stimulus is one of current and voltage and the electrical parameter is the other one of current and voltage.

21. The ease method of claim 19 further comprising (6) providing the receiver such that the body (1102) includes a dispense hole (1108) that is at least as large as the first region.

22. The method of claim 16 wherein the first impedance is measured across at least a portion of a first dispensing region (138-1) of the plurality thereof.

23. The method of claim 22 further comprising:
(4) providing the receiver such that it includes a sensor array (118) comprising a first through-hole (506-1) and a first sensor (504-1) having a first contact (602A-1) and a second contact (602B-1), the first and second contacts being separated by at least a portion of the first through-hole;
(5) electrically coupling the first dispensing region and each of the first and second contacts such that at least a portion of the first dispensing region is between the first and second contacts; and
(6) measuring a second impedance between the first and second contacts;
wherein the second impedance is the first impedance.

24. The method of claim 23 wherein the first and second contacts are electrically coupled with the first dispensing region by via capacitive coupling.

25. The method of claim 23 wherein the first and second contacts are electrically coupled with the first dispensing region by establishing physical and electrical connection between the first dispensing region and each of the first and second contacts.

26. The method of claim 23 wherein the sensor array is provided such that (A) the first through-hole includes a serration (510) having a tip (608) that is configured to initiate puncture of the lidding film in the first dispensing region in response to application of a force, F, applied to a first blister (140-1) and (B) the first contact includes a first contact point (604A-1) and the second contact includes a second contact point (604B-1), and wherein at least one of the first and second contact points is disposed on the tip.

27. The method of claim 23 wherein receiver is provided such that the sensor array further comprises a second through-hole (506-2) and a second sensor (504-2) having a third contact (602A-2) and a fourth contact (602B-2), the third and fourth contacts being separated by at least a portion of the second through-hole;
(7) electrically coupling the second dispensing region and each of the third and fourth contacts such that at least a portion of the second dispensing region is between the third and fourth contacts; and
(8) measuring a third impedance between the third and fourth contacts.

28. The method of claim 16 further comprising (5) measuring a user parameter selected from a group consisting of bio-impedance and bio-potential.

29. The method of claim 16 further comprising (5) measuring a. user parameter selected from a group consisting of bio-impedance and bio-potential, wherein the user parameter is measured at a multi-electrode touch sensor included in one of the electronics module and detection module.

30. The method of claim 17 further comprising:
providing a case (100) having a housing (302) that includes the body and a lid (318), wherein housing has an open state that enables access to the plurality of reservoirs and a closed state that prevents access to the plurality of reservoirs; and
enabling the open state only when user authentication succeeds.

31. A smart case (100) for monitoring the state of a blister card (126) that includes a forming film (130), a lidding film (132) that includes a first region (142) that is electrically conductive and unpatterned and includes a plurality of dispensing regions (138) within the first region, and a plurality of tablets (128) contained in a plurality of reservoirs (136) that is arranged in a first arrangement, each reservoir being defined by the forming, film and a different dispensing region of the plurality thereof, wherein the case comprises:
(1) an electronics module (102) that includes a sensor circuit (214); and
(2) a detection module (104) that includes:
(i) a housing (302) having a lid (318) and a body (316), wherein the lid is movable relative to the body:
(ii) a receiver (116) that includes:
(a) a frame (304)
(b) a seat (306); and
(c) a sensor array (118) that includes a plurality of connectors (336), wherein the sensor array is configured to monitor the state of a blister card via a technology selected from a group consisting of electrical impedance tomography imaging, electrical resistance tomography imaging, capacitive sensing, strain sensing, optical sensing, acoustic sensing, tactile sensing, thermal sensing, and magnetic sensing;
wherein the plurality of connectors is electrically connected with the electronics module when the electronics module and detection module are operatively coupled.

32. The case of claim 31 wherein the sensor array includes at least one through-hole (506) having a serration (510) that comprises a tip (608) that is configured to initiate puncture of the lidding film in response to application of a force (F) applied to a blister of the plurality thereof.

33. The case of claim 31 wherein the sensor array includes a first sensor (624-1) that is a capacitive sensor whose output signal is based on the state of a first dispensing region (138-1) of the plurality thereof.

34. The case of claim 33 wherein the first sensor includes:
a through-hole (506) having a serration (510) that comprises a tip (608) that is configured to initiate puncture of the lidding film in response to application of a force (F) applied to a blister of the plurality thereof;
at least one contact (602A) that is disposed on the serration and configured to electrically couple with the lidding film when the blister card is located in the receiver.

35. The case of claim 34 wherein the first sensor further includes:
a first electrode that is disposed in a first plane; and
a second electrode that is disposed in a second plane that is parallel with the first plane;
wherein the first plane is between the lidding film and the second plane when the blister card is located in the receiver;
wherein the first and first dispensing region collectively define a first capacitor having a first capacitance that is based on the state of the first dispensing region; and
wherein at least one of the lidding film and the second electrode is configured to function as an electrical shield for the first electrode.

36. The case of claim 35 wherein the first sensor (624-1) further includes a shield line that surrounds at least a portion of the first electrode in the first plane, the shield line being configured to function as an electrical shield for the first electrode.

* * * * *